United States Patent
Harris et al.

(10) Patent No.: US 6,754,086 B2
(45) Date of Patent: Jun. 22, 2004

(54) INTEGRATED MAGNETIC BUCK CONVERTER WITH MAGNETICALLY COUPLED SYNCHRONOUSLY RECTIFIED MOSFET GATE DRIVE

(75) Inventors: Philip M. Harris, San Diego, CA (US); Joseph T. DiBene, II, Oceanside, CA (US)

(73) Assignee: Incep Technologies, Inc., San Diego, CA (US)

(*) Notice: Subject to any disclaimer, the term of this patent is extended or adjusted under 35 U.S.C. 154(b) by 31 days.

(21) Appl. No.: 10/245,908
(22) Filed: Sep. 17, 2002

(65) Prior Publication Data

US 2003/0052655 A1 Mar. 20, 2003

Related U.S. Application Data

(63) Continuation-in-part of application No. 10/022,454, filed on Oct. 30, 2001, now Pat. No. 6,556,455, and a continuation-in-part of application No. 09/885,780, filed on Jun. 19, 2001, now abandoned, which is a continuation-in-part of application No. 09/353,428, filed on Jul. 15, 1999, now Pat. No. 6,304,450, application No. 10/245,908, which is a continuation-in-part of application No. 09/432,878, filed on Nov. 2, 1999, now Pat. No. 6,356,448, which is a continuation-in-part of application No. 09/353,428, application No. 10/245,908, which is a continuation-in-part of application No. 09/727,016, filed on Nov. 28, 2000, now abandoned, and a continuation-in-part of application No. 09/785,892, filed on Feb. 16, 2001, now Pat. No. 6,452,113, and a continuation-in-part of application No. 09/798,541, filed on Mar. 2, 2001, now abandoned, which is a continuation-in-part of application No. 09/727,016, and a continuation-in-part of application No. 09/785,892, said application No. 09/798,541, is a continuation-in-part of application No. 09/432,878, which is a continuation-in-part of application No. 09/353,428, application No. 10/245,908, which is a continuation-in-part of application No. 09/801,437, filed on Mar. 8, 2001, now Pat. No. 6,618,268, which is a continuation-in-part of application No. 09/798,541, and a continuation-in-part of application No. 09/785,892, and a continuation-in-part of application No. 09/727,016, and a continuation-in-part of application (List continued on next page.)

(51) Int. Cl.[7] .............................................. H01R 12/16
(52) U.S. Cl. ......................... 361/785; 361/18; 327/540
(58) Field of Search ........... 361/18, 785; 327/374–377, 327/380–382, 540–543

(56) References Cited

U.S. PATENT DOCUMENTS

| 4,857,822 A | 8/1989 | Tabisz et al. |
| 4,858,093 A | 8/1989 | Sturgeon |
| 4,864,478 A | 9/1989 | Bloom |

(List continued on next page.)

FOREIGN PATENT DOCUMENTS

| EP | 0 439 151 A | 7/1991 |

OTHER PUBLICATIONS

Chung, H.S.H., et Al. "A ZCS Bi–directional Flyback DC/DC Converter Using the Leakage Inductance of the Coupled Inductor", APEC proceedings, 2000.

Law, Y.Y., et Al. "Comparison of Three Topologies for VRM Fast Transient Application", APEC proceedings, 2002.

Peng, Y., et Al. "Investigation of Candidate Topolgies for 12V VRM", APEC proceedings, 2002.

(List continued on next page.)

Primary Examiner—Evan Pert
Assistant Examiner—Tuan Dinh
(74) Attorney, Agent, or Firm—Knobbe Martens Olson & Bear LLP

(57) ABSTRACT

A synchronous voltage regulation circuit having an energy storage circuit for controlling the output signal is disclosed. The voltage regulation circuit includes a circuit which advantageously uses leakage inductance from loose coupling of input and output inductors to control regulator switching.

12 Claims, 10 Drawing Sheets

No. 09/432,878, which is a continuation-in-part of application No. 09/353,428, application No. 10/245,908, which is acontinuation-in-part of application No. 09/802,329, filed on Mar. 8, 2001, now Pat. No. 6,452,804, which is a continuation-in-part of application No. 09/798,541, which is a continuation-in-part of application No. 09/727,016, and a continuation-in-part of application No. 09/785,892, and a continuation-in-part of application No. 09/432,878, which is a continuation-in-part of application No. 09/353,428, said application No. 09/802,329, is a continuation-in-part of application No. 09/785,892, and a continuation-in-part of application No. 09/727,016, and a continuation-in-part of application No. 09/432,878, which is a continuation-in-part of application No. 09/353,428, application No. 10/245,908, which is a continuation-in-part of application No. 09/910,524, filed on Jul. 20, 2001, now abandoned, which is a continuation-in-part of application No. 09/801,437, and a continuation-in-part of application No. 09/802,329, and a continuation-in-part of application No. 09/798,541, and a continuation-in-part of application No. 09/785,892, and a continuation-in-part of application No. 09/727,016, and a continuation-in-part of application No. 09/432,878, which is a continuation-in-part of application No. 09/353,428, application No. 10/245,908, which is a continuation-in-part of application No. 09/818,173, filed on Mar. 26, 2001, now abandoned, which is a continuation-in-part of application No. 09/801,437, and a continuation-in-part of application No. 09/802,329, and a continuation-in-part of application No. 09/798,541, which is a continuation-in-part of application No. 09/727,016, and a continuation-in-part of application No. 09/785,892, and a continuation-in-part of application No. 09/432,878, which is a continuation-in-part of application No. 09/353,428, said application No. 09/818,173, is a continuation-in-part of application No. 09/785,892, and a continuation-in-part of application No. 09/727,016, and a continuation-in-part of application No. 09/432,878, which is a continuation-in-part of application No. 09/353,428, application No. 10/245,908, which is a continuation-in-part of application No. 09/921,153, filed on Aug. 2, 2001, now Pat. No. 6,490,160, which is a continuation-in-part of application No. 09/921,152, filed on Aug. 2, 2001, now Pat. No. 6,609,914, and a continuation-in-part of application No. 09/910,524, filed on Jul. 20, 2001, now abandoned, and a continuation-in-part of application No. 09/801,437, and a continuation-in-part of application No. 09/802,329, and a continuation-in-part of application No. 09/798,541, which is a continuation-in-part of application No. 09/727,016, and a continuation-in-part of application No. 09/785,892, and a continuation-in-part of application No. 09/432,878, which is a continuation-in-part of application No. 09/353,428, said application No. 09/921,153, is a continuation-in-part of application No. 09/727,016, said application No. 09/921,153, is a continuation-in-part of application No. 09/432,878, which is a continuation-in-part of application No. 09/353,428, application No. 10/245,908, which is a continuation-in-part of application No. 09/921,152, which is a continuation-in-part of application No. 09/921,153, and a continuation-in-part of application No. 09/910,524, and a continuation-in-part of application No. 09/801,437, and a continuation-in-part of application No. 09/802,329, and a continuation-in-part of application No. 09/798,541, which is a continuation-in-part of application No. 09/727,016, and a continuation-in-part of application No. 09/785,892, and a continuation-in-part of application No. 09/432,878, and a continuation-in-part of application No. 09/353,428, said application No. 09/921,152, is a continuation-in-part of application No. 09/785,892, and a continuation-in-part of application No. 09/727,016, and a continuation-in-part of application No. 09/432,878, which is a continuation-in-part of application No. 09/353,428, application No. 10/245,908, which is a continuation-in-part of application No. 10/036,957, filed on Dec. 20, 2001, which is a continuation-in-part of application No. 09/885,780, and a continuation-in-part of application No. 09/727,016, and a continuation-in-part of application No. 09/432,878, application No. 10/245,908, which is a continuation-in-part of application No. 09/785,892, and a continuation-in-part of application No. 09/798,541, which is a continuation-in-part of application No. 09/727,016, and a continuation-in-part of application No. 09/785,892, and a continuation-in-part of application No. 09/432,878, which is a continuation-in-part of application No. 09/353,428, application No. 10/245,908, which is a continuation-in-part of application No. 09/801,437, which is a continuation-in-part of application No. 09/798,541, and a continuation-in-part of application No. 09/785,892, and a continuation-in-part of application No. 09/727,016, and a continuation-in-part of application No. 09/432,878, which is a continuation-in-part of application No. 09/353,428, application No. 10/245,908, which is a continuation-in-part of application No. 09/802,329, which is a continuation-in-part of application No. 09/798,541, which is a continuation-in-part of application No. 09/727,016, and a continuation-in-part of application No. 09/785,892, and a continuation-in-part of application No. 09/432,878, which is a continuation-in-part of application No. 09/353,428, said application No. 09/802,329, is a continuation-in-part of application No. 09/785,892, and a continuation-in-part of application No. 09/727,016, and a continuation-in-part of application No. 09/432,878, which is a continuation-in-part of application No. 09/353,428, application No. 10/245,908, which is a continuation-in-part of application No. 09/910,524, which is a continuation-in-part of application No. 09/801,437, and a continuation-in-part of application No. 09/802,329, and a continuation-in-part of application No. 09/798,541, and a continuation-in-part of application No. 09/785,892, and a continuation-in-part of application No. 09/727,016, and a continuation-in-part of application No. 09/432,878, which is a continuation-in-part of application No. 09/353,428, application No. 10/245,908, which is a continuation-in-part of application No. 09/818,173, which is a continuation-in-part of application No. 09/801,437, and a continuation-in-part of application No. 09/798,541, which is a continuation-in-part of application No. 09/727,016, and a continuation-in-part of application No. 09/785,892, and a continuation-in-part of application No. 09/432,878, which is a continuation-in-part of application No. 09/353,428, said application No.

09/818,173, is a continuation-in-part of application No. 09/785,892, and a continuation-in-part of application No. 09/727,016, and a continuation-in-part of application No. 09/432,878, which is a continuation-in-part of application No. 09/353,428, said application No. 09/921,153, is a continuation-in-part of application No. 09/785,892, and a continuation-in-part of application No. 09/727,016, and a continuation-in-part of application No. 09/432,878, which is a continuation-in-part of application No. 09/353,428, application No. 10/245,908, which is a continuation-in-part of application No. 09/921,152, which is a continuation-in-part of application No. 09/921,153, and a continuation-in-part of application No. 09/910,524, and a continuation-in-part of application No. 09/801,437, and a continuation-in-part of application No. 09/802,329, and a continuation-in-part of application No. 09/798,541, which is a continuation-in-part of application No. 09/727,016, and a continuation-in-part of application No. 09/785,892, and a continuation-in-part of application No. 09/432,878, which is a continuation-in-part of application No. 09/353,428, said application No. 09/921,152, is a continuation-in-part of application No. 09/785,892, and a continuation-in-part of application No. 09/727,016, and a continuation-in-part of application No. 09/432,878, which is a continuation-in-part of application No. 09/353,428, application No. 10/245,908, which is a continuation-in-part of application No. 10/022,454, which is a continuation-in-part of application No. 09/818,173, and a continuation-in-part of application No. 09/921,152, and a continuation-in-part of application No. 09/921,153, and a continuation-in-part of application No. 09/910,524, and a continuation-in-part of application No. 09/885,780, which is a continuation of application No. 09/353,428, said application No. 10/022,454, is a continuation-in-part of application No. 09/801,437, and a continuation-in-part of application No. 09/802,329, and a continuation-in-part of application No. 09/798,541, which is a continuation-in-part of application No. 09/727,016, and a continuation-in-part of application No. 09/432,878, which is a continuation-in-part of application No. 09/353,428, said application No. 10/022,454, is a continuation-in-part of application No. 09/785,892, and a continuation-in-part of application No. 09/727,016, and a continuation-in-part of application No. 09/432,878, which is a continuation-in-part of application No. 09/353,428.

(60) Provisional application No. 60/387,941, filed on Jun. 11, 2002, provisional application No. 60/359,504, filed on Feb. 25, 2002, provisional application No. 60/338,004, filed on Nov. 8, 2001, provisional application No. 60/313,338, filed on Aug. 17, 2001, provisional application No. 60/310,038, filed on Aug. 3, 2001, provisional application No. 60/304,930, filed on Jul. 11, 2001, provisional application No. 60/304,929, filed on Jul. 11, 2001, provisional application No. 60/301,753, filed on Jun. 27, 2001, provisional application No. 60/299,573, filed on Jun. 19, 2001, provisional application No. 60/292,125, filed on May 18, 2001, provisional application No. 60/291,772, filed on May 16, 2001, provisional application No. 60/291,749, filed on May 16, 2001, provisional application No. 60/287,860, filed on May 1, 2001, provisional application No. 60/277,369, filed on Mar. 19, 2001, provisional application No. 60/266,941, filed on Feb. 6, 2001, provisional application No. 60/251,223, filed on Dec. 4, 2000, provisional application No. 60/251,222, filed on Dec. 4, 2000, provisional application No. 60/251,184, filed on Dec. 4, 2000, provisional application No. 60/232,971, filed on Sep. 14, 2000, provisional application No. 60/222,407, filed on Aug. 2, 2000, provisional application No. 60/222,386, filed on Aug. 2, 2000, provisional application No. 60/219,813, filed on Jul. 21, 2000, provisional application No. 60/219,506, filed on Jul. 20, 2000, provisional application No. 60/196,059, filed on Apr. 10, 2000, provisional application No. 60/187,777, filed on Mar. 8, 2000, provisional application No. 60/186,769, filed on Mar. 3, 2000, provisional application No. 60/183,474, filed on Feb. 18, 2000, provisional application No. 60/171,065, filed on Dec. 16, 1999, and provisional application No. 60/167,792, filed on Nov. 29, 1999.

U.S. PATENT DOCUMENTS

| 5,550,497 | A  | * | 8/1996  | Carobolante ............... 327/110 |
| 5,592,071 | A  |   | 1/1997  | Brown |
| 5,892,425 | A  |   | 4/1999  | Kuhn et al. |
| 6,091,276 | A  | * | 7/2000  | Aiello et al. ............... 327/376 |
| 6,094,038 | A  |   | 7/2000  | Lethellier |
| 6,094,087 | A  | * | 7/2000  | He et al. .................... 327/434 |
| 6,169,683 | B1 |   | 1/2001  | Farrington |
| 6,195,273 | B1 |   | 2/2001  | Shteynberg |
| 6,262,566 | B1 |   | 7/2001  | Dinh |
| 6,271,712 | B1 |   | 8/2001  | Ball |
| 6,275,018 | B1 |   | 8/2001  | Telefus et al. |
| 6,307,757 | B1 |   | 10/2001 | Porter et al. |
| 6,310,469 | B1 |   | 10/2001 | Bentolila et al. |
| 6,445,244 | B1 | * | 9/2002  | Stratakos et al. ........... 327/540 |

OTHER PUBLICATIONS

Quirke; M.T., et Al. "Planar Magnetic Component Technology–A Review", IEEE Transactions on Components, Hybrids, and Manufacturing Technology, 1992.

Wei, J., et Al. "A High Efficiency Topology for 12V VRM—Push–Pull Buck and Its Integrated Magnetics Implementations", APEC proceedings, 2002.

Wong, P.L. et. Al. "Investigating Coupling Inductors in the Interleaving QSW VRM", APEC proceedings, 2000.

Wong, P.L., et. Al. "Switching Action Delays in Voltage Regulation Modules", APEC proceedings, 2002.

Yao, K., et. Al. "Tapped–Inductor Buck Converters with A Lossiess Clamp Circuit", APEC proceedings, 2002.

Larner, David: "Keeping it all in Synch", *New Electronics*, pp. 43–44 (Apr. 27, 1999).

Maxim: "Une conversion d'énergie à rendement supérieur à 96%", *Electronique* No. 98, p. 93 (Dec. 1999).

Documents cited In: International Search Report re PCT/US03/05565; Date of mailing of Search Report: Jul. 23, 2003.

* cited by examiner

INTEGRATED MAGNETIC BUCK CONVERTER WITH MAGNETICALLY COUPLED SYNCHRONOUSLY RECTIFIED MOSFET GATE DRIVE

CROSS-REFERENCE TO RELATED APPLICATIONS

This application claims benefit of the following U.S. Provisional Patent Applications, each of which are incorporated by reference herein:

U.S. patent application Ser. No. 60/359,504, entitled "HIGH EFFICIENCY VRM CIRCUIT CONSTRUCTIONS FOR LOW VOLTAGE, HIGH CURRENT ELECTRONIC DEVICES," by Philip M. Harris, filed Feb. 25, 2002; and U.S. patent application Ser. No. 60/387,941, entitled "INTEGRATED MAGNETIC BUCK CONVERTER WITH MAGNETICALLY COUPLED SYNCHRONOUSLY RECTIFIED MOSFET GATE DRIVE," by Philip M. Harris, filed Jun. 11, 2002;

This application is also a continuation-in-part of the following U.S. patent applications, each of which are hereby incorporated by reference herein:

U.S. patent application Ser. No. 10/022,454, entitled "ULTRA-LOW IMPEDANCE POWER INTERCONNECTION SYSTEM FOR ELECTRONIC PACKAGES," by Joseph T. DiBene II, David H. Hartke, Carl E. Hoge, and Edward J. Derian, filed Oct. 30, 2001, now U.S. Pat. No. 6,556,455, which application claims benefit of the following provisional patent applications, which are hereby incorporated by reference herein.

Application Serial No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Serial No. 60/251,223, entitled "MICRO-I-PAK FOR POWER DELIVERY TO MICROELECTRONICS," by Joseph T. DiBene II and Carl E. Hoge, filed Dec. 4, 2000;

Application Serial No. 60/251,184, entitled "MICROPROCESSOR INTEGRATED PACKAGING," by Joseph T. DiBene II, filed Dec. 4, 2000.

Application Serial No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by Joseph T. DiBene II, David H. Hartke, and James M. Broder, filed Feb. 6, 2001;

Application Serial No. 60/277,369, entitled "THERMAL-MECHANICAL MEASUREMENT AND ANALYSIS OF ADVANCED THERMAL INTERFACE MATERIAL CONSTRUCTION," by Joseph T. DiBene II, David H. Hartke, and Farhad Raiszadeh, filed Mar. 19, 2001;

Application Serial No. 60/287,860, entitled "POWER TRANSMISSION DEVICE," by Joseph T. DiBene II, David H. Hartke, Carl E. Hoge, and Edward J. Derian, filed May 1, 2001;

Application Serial No. 60/291,749, entitled "MICRO I-PAK ARCHITECTURE HAVING A FLEXIBLE CONNECTOR BETWEEN A VOLTAGE REGULATION MODULE AND SUBSTRATE," by Joseph T. DiBene II, filed May 16, 2001;

Application Serial No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

Application Serial No. 60/292,125, entitled "VORTEX HEATSINK FOR LOW PRESSURE DROP HIGH PERFORMANCE THERMAL MANAGEMENT ELECTRONIC ASSEMBLY SOLUTIONS," by Joseph T. DiBene II, and Farhad Raiszadeh, filed May 18, 2001;

Application Serial No. 60/299,573, entitled "IMPROVED MICRO-I-PAK STACK-UP ARCHITECTURE," by Joseph T. DiBene, Carl E. Hoge, and David H. Hartke, filed Jun. 19, 2001;

Application Serial No. 60/301,753, entitled "INTEGRATED POWER DELIVERY USING HIGH PERFORMANCE LINEAR REGULATORS ON PACKAGE WITH A MICROPROCESSOR," by Joseph T. DiBene II, Carl E. Hoge, and David H. Hartke, filed Jun. 27, 2001;

Application Serial No. 60/304,929, entitled "BORREGO ARCHITECTURE," by David H. Hartke and Joseph T. DiBene II, filed Jul. 11, 2001;

Application Serial No. 60/304,930, entitled "MICRO-I-PAK," by Joseph T. DiBene II, Carl E. Hoge, David H. Hartke, and Edward J. Derian, filed Jul. 11, 2001;

Application Serial No. 60/310,038, entitled "TOOL-LESS CONCEPTS FOR BORREGO," by Edward J. Derian and Joseph T. DiBene II, filed Aug. 3, 2001; and Application Serial No. 60/313,338, entitled "TOOLLESS PRISM IPA ASSEMBLY TO SUPPORT IA64 MCKINLEY MICROPROCESSOR," by David H. Hartke and Edward J. Derian, filed Aug. 17, 2001;

and which patent application is also continuation-in-part of the following co-pending and commonly assigned patent applications, each of which applications are hereby incorporated by reference herein:

Application Ser. No. 09/885,780, entitled "INTER-CIRCUIT ENCAPSULATED PACKAGING," by Joseph T. DiBene II and David H. Hartke, filed Jun. 19, 2001, now abandoned, which is a continuation in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450;

Application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999, now issued as U.S. Pat. No. 6,356,448, and now issued as U.S. Pat. No. 6,356,448, which is a continuation-in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450;

Application Ser. No. 09/727,016, entitled "EMI CONTAINMENT USING INTER-CIRCUIT

ENCAPSULATED PACKAGING TECHNOLOGY" by Joseph T. DiBene II and David Hartke, filed Nov. 28, 2000, now abandoned, which claims priority to the following U.S. Provisional Patent Applications:

Application Serial No. 60/167,792, entitled "EMI CONTAINMENT USING INTER-CIRCUIT ENCAPSULATED PACKAGING TECHNOLOGY," by Joseph T. DiBene II and David H. Hartke, filed Nov. 29, 1999;

Application Serial No. 60/171,065, entitled "INTER-CIRCUIT ENCAPSULATED PACKAGING TECHNOLOGY," by Joseph T. DiBene II and David H. Hartke, filed Dec. 16, 1999;

Application Serial No. 60/183,474, entitled "DIRECT ATTACH POWER/THERMAL WITH INCEP," by Joseph T. DiBene II and David H. Hartke, filed Feb. 18, 2000;

Application Serial No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Serial No. 60/196,059, entitled "EMI FRAME WITH POWER FEED-THROUGH AND THERMAL INTERFACE MATERIAL IN AN AGGREGATE DIAMOND MIXTURE," by Joseph T. DiBene II and David H. Hartke, filed Apr. 10, 2000;

Application Serial No. 60/219,506, entitled "HIGH. PERFORMANCE THERMAL MECHANICAL INTERFACE," by Wendell C. Johnson, David H. Hartke, and Joseph T. DiBene II, filed Jul. 20, 2000;

Application Serial No. 60/219,813, entitled "HIGH-CURRENT MICROPROCESSOR POWER DELIVERY SYSTEMS," by Joseph T. DiBene II, filed Jul. 21, 2000;

Application Serial No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Serial No. 60/222,407, entitled "VAPOR HEAT SINK COMBINATION FOR HIGH EFFICIENCY THERMAL MANAGEMENT," by David H. Hartke and Joseph T. DiBene II, filed Aug. 2, 2000; and Application Serial No. 60/232,971, entitled "INTEGRATED POWER DISTRIBUTION AND SEMICONDUCTOR PACKAGE," by Joseph T. DiBene II and James J. Hjerpe, filed Sep. 14, 2000;

Application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II, David H. Hartke, James J. Hjerpe Kaskade, and Carl E. Hoge, filed Feb. 16, 2001, now U.S. Pat. No. 6,452,113, which claims priority to the following Provisional Patent Applications:

Application Serial No. 60/183,474, entitled "DIRECT ATTACH POWER/THERMAL WITH INCEP," by Joseph T. DiBene II and David H. Hartke, filed Feb. 18, 2000;

Application Serial No. 60/186,769, entitled "THERMACEP SPRING BEAM," by Joseph T. DiBene II and David H. Hartke, filed Mar. 3, 2000;

Application Serial No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Serial No. 60/196,059, entitled "EMI FRAME WITH POWER FEED-THROUGH AND THERMAL INTERFACE MATERIAL IN AN AGGREGATE DIAMOND MIXTURE," by Joseph T. DiBene II and David H. Hartke, filed Apr. 10, 2000;

Application Serial No. 60/219,506, entitled "HIGH. PERFORMANCE THERMAL MECHANICAL INTERFACE," by Wendell C. Johnson, David H. Hartke and Joseph T. DiBene II, filed Jul. 20, 2000;

Application Serial No. 60/219,813, entitled "HIGH-CURRENT MICROPROCESSOR POWER DELIVERY SYSTEMS," by Joseph T. DiBene II, filed Jul. 21, 2000;

Application Serial No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Serial No. 60/222,407, entitled "VAPOR HEAT SINK COMBINATION FOR HIGH EFFICIENCY THERMAL MANAGEMENT," by David H. Hartke and Joseph T. DiBene II, filed Aug. 2, 2000;

Application Serial No. 60/232,971, entitled "INTEGRATED POWER DISTRIBUTION AND SEMICONDUCTOR PACKAGE," by Joseph T. DiBene II and James J. Hjerpe, filed Sep. 14, 2000;

Application Serial No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Serial No. 60/251,223, entitled "MICRO I-PAK FOR POWER DELIVERY TO MICROELECTRONICS," by Joseph T. DiBene II and Carl E. Hoge, filed Dec. 4, 2000;

Application Serial No. 60/251,184, entitled "MICROPROCESSOR INTEGRATED PACKAGING," by Joseph T. DiBene II, filed Dec. 4, 2000;

Application Serial No. 60/266,941, entitled "MECHANICAL INTERCONNECTION TECHNOLOGIES USING FLEX CABLE INTERCONNECT FOR DELIVERY IN 'INCEP' INTEGRATED ARCHITECTURE," by David H. Hartke, James M. Broder, and Joseph T. DiBene II, filed Feb. 6, 2001; and Application Ser. No. 09/798,541, entitled "THERMAL/MECHANICAL SPRINGBEAM MECHANISM FOR HEAT TRANSFER FROM HEAT SOURCE TO HEAT DISSIPATING DEVICE," by Joseph T. DiBene II, David H.

Hartke, Wendell C. Johnson, and Edward J. Derian, filed Mar. 2, 2001, now abandoned, which is a continuation-in-part of application Ser. No. 09/727,016, entitled "EMI CONTAINMENT USING INTER-CIRCUIT ENCAPSULATED PACKAGING TECHNOLOGY," by Joseph T. DiBene II and David H. Hartke, filed Nov. 28, 2000, and a continuation-in-part of application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II and David H. Hartke, filed Feb. 16, 2001, and a continuation in part of application Ser. No. 09/432,878, entitled "INTER-CIRCUIT ENCAPSULATED PACKAGING FOR POWER DELIVERY", by Joseph T. DiBene II and David H. Hartke, filed Nov. 2, 1999, now issued as U.S. Pat. No. 6,356,448, which is a continuation in part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450,
and which claims priority to the following U.S. Provisional Patent Applications:
Application Serial No. 60/183,474, entitled "DIRECT ATTACH POWER/THERMAL WITH INCEP," by Joseph T. DiBene II and David H. Hartke, filed Feb. 18, 2000;
Application Serial No. 60/186,769, entitled "THERMACEP SPRING BEAM," by Joseph T. DiBene II and David H. Hartke, filed Mar. 3, 2000;
Application Serial No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;
Application Serial No. 60/196,059, entitled "EMI FRAME WITH POWER FEED-THROUGH AND THERMAL INTERFACE MATERIAL IN AN AGGREGATE DIAMOND MIXTURE," by Joseph T. DiBene II and David H. Hartke, filed Apr. 10, 2000;
Application Serial No. 60/219,506, entitled "HIGH PERFORMANCE THERMAL MECHANICAL INTERFACE," by Wendell C. Johnson, David H. Hartke, and Joseph T. DiBene II, filed Jul. 20, 2000;
Application Serial No. 60/219,813, entitled "HIGH-CURRENT MICROPROCESSOR POWER DELIVERY SYSTEMS," by Joseph T. DiBene II, filed Jul. 21, 2000;
Application Serial No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;
Application Serial No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000;
Application Serial No. 60/232,971, entitled "INTEGRATED POWER DISTRIBUTION AND SEMICONDUCTOR PACKAGE," by Joseph T. DiBene II and James J. Hjerpe, filed Sep. 14, 2000;
Application Serial No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;
Application Serial No. 60/251,223, entitled "MICRO I-PAK FOR POWER DELIVERY TO MICROELECTRONICS," by Joseph T. DiBene II and Carl E. Hoge, filed Dec. 4, 2000;
Application Serial No. 60/251,184, entitled "MICROPROCESSOR INTEGRATED PACKAGING," by Joseph T. DiBene II, filed Dec. 4, 2000; and
Application Serial No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, and Joseph T. DiBene II, filed Feb. 6, 2001; and
Application Ser. No. 09/801,437, entitled "METHOD AND APPARATUS FOR DELIVERING POWER TO HIGH PERFORMANCE ELECTRONIC ASSEMBLIES" by Joseph T. DiBene II, David H. Hartke, Carl E. Hoge, James M. Broder, Edward J. Derian, Joseph S. Riel, and Jose B. San Andres, filed Mar. 8, 2001, now U.S. Pat. No. 6,618,268, which is a continuation in part of the following patent applications:
Application Ser. No. 09/798,541, entitled "THERMAL/MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001;
Application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II, David H. Hartke, James J. Hjerpe Kaskade, and Carl E. Hoge, filed Feb. 16, 2001;
Application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000;
Application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999, now issued as U.S. Pat. No. 6,356,448, which is a continuation-in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450; and which claims priority to the following U.S. Provisional Patent Applications:
Application Serial No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Serial No. 60/196,059, entitled "EMI FRAME WITH POWER FEED-THROUGH AND THERMAL INTERFACE MATERIAL IN AN AGGREGATE DIAMOND MIXTURE," by Joseph T. DiBene II and David H. Hartke, filed Apr. 10, 2000;

Application Serial No. 60/219,813, entitled "HIGH-CURRENT MICROPROCESSOR POWER DELIVERY SYSTEMS," by Joseph T. DiBene II, filed Jul. 21, 2000;

Application Serial No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Serial No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000;

Application Serial No. 60/232,971, entitled "INTEGRATED POWER DISTRIBUTION AND SEMICONDUCTOR PACKAGE," by Joseph T. DiBene II and James J. Hjerpe, filed Sep. 14, 2000;

Application Serial No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Serial No. 60/251,223, entitled "MICRO I-PAK FOR POWER DELIVERY TO MICROELECTRONICS," by Joseph T. DiBene II and Carl E. Hoge, filed Dec. 4, 2000;

Application Serial No. 60/251,184, entitled "MICROPROCESSOR INTEGRATED PACKAGING," by Joseph T. DiBene II, filed Dec. 4, 2000; and Application Serial No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, and Joseph T. DiBene II, filed Feb. 6, 2001; and Application Ser. No. 09/802,329, entitled "METHOD AND APPARATUS FOR THERMAL AND MECHANICAL MANAGEMENT OF A POWER REGULATOR MODULE AND MICROPROCESSOR IN CONTACT WITH A THERMALLY CONDUCTING PLATE" by Joseph T. DiBene II and David H. Hartke, filed Mar. 8, 2001, now U.S. Pat. No. 6,452,804, which is a continuation in part of the following patent applications:

Application Ser. No. 09/798,541, entitled "THERMAL/MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001, which is a continuation-in-part of application Ser. No. 09/727,016, entitled "EMI CONTAINMENT USING INTER-CIRCUIT ENCAPSULATED PACKAGING TECHNOLOGY," by Joseph T. DiBene II and David H. Hartke, filed Nov. 28, 2000, and a continuation-in-part of application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II and David H. Hartke, filed Feb. 16, 2001, and a continuation in part of application Ser. No. 09/432,878, entitled "INTER-CIRCUIT ENCAPSULATED PACKAGING FOR POWER DELIVERY", by Joseph T. DiBene II and David H. Hartke, filed Nov. 2, 1999, now issued as U.S. Pat. No. 6,356,448, which is a continuation in part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450;

Application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II, David H. Hartke, James J. Hjerpe Kaskade, and Carl E. Hoge, filed Feb. 16, 2001;

Application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000;

Application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999, now issued as U.S. Pat. No. 6,356,448, which is a continuation-in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450, and which claims priority to the following U.S. Provisional Patent Applications:

Application Serial No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Serial No. 60/196,059, entitled "EMI FRAME WITH POWER FEED-THROUGH AND THERMAL INTERFACE MATERIAL IN AN AGGREGATE DIAMOND MIXTURE," by Joseph T. DiBene II and David H. Hartke, filed Apr. 10, 2000;

Application Serial No. 60/219,813, entitled "HIGH-CURRENT MICROPROCESSOR POWER DELIVERY SYSTEMS," by Joseph T. DiBene II, filed Jul. 21, 2000;

Application Serial No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Serial No. 60/222,407, entitled "VAPOR HEAT-SINK COMBINATION FOR HIGH EFFICIENCY THERMAL MANAGEMENT," by David H. Hartke and Joseph T. DiBene II, filed Aug. 2, 2000; and Application Serial No. 60/232,971, entitled "INTEGRATED POWER DISTRIBUTION AND SEMICONDUCTOR PACKAGE," by Joseph T. DiBene II and James J. Hjerpe, filed Sep. 14, 2000;

Application Serial No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Serial No. 60/251,223, entitled "MICRO I-PAK FOR POWER DELIVERY TO MICROELECTRONICS," by Joseph T. DiBene II and Carl E. Hoge, filed Dec. 4, 2000;

Application Serial No. 60/251,184, entitled "MICROPROCESSOR INTEGRATED PACKAGING," by Joseph T. DiBene II, filed Dec. 4, 2000; and Application Serial No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, and Joseph T. DiBene II, filed Feb. 6, 2001; and Application Ser. No. 09/910,524, entitled "HIGH PERFORMANCE THERMAL/MECHANICAL INTERFACE FOR FIXED-GAP REFERENCES FOR HIGH HEAT FLUX AND POWER SEMICONDUCTOR APPLICATIONS", by Joseph T. DiBene II, David H. Hartke, Wendell C. Johnson, Farhad Raiszadeh, Edward J. Darien, and Jose B. San Andres, filed Jul. 20, 2001, now abandoned, which is a continuation in part of the following patent applications:

Application Ser. No. 09/801,437, entitled "METHOD AND APPARATUS FOR DELIVERING POWER TO HIGH PERFORMANCE ELECTRONIC ASSEMBLIES" by Joseph T. DiBene II, David H. Hartke, Carl E. Hoge, James M. Broder, Edward J. Derian, Joseph S. Riel, and Jose B. San Andres, filed Mar. 8, 2001;

Application Ser. No. 09/802,329, entitled "METHOD AND APPARATUS FOR THERMAL AND MECHANICAL MANAGEMENT OF A POWER REGULATOR MODULE AND MICROPROCESSOR IN CONTACT WITH A THERMALLY CONDUCTING PLATE" by Joseph T. DiBene II and David H. Hartke, filed Mar. 8, 2001;

Application Ser. No. 09/798,541, entitled "THERMAL/MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001;

Application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II, David H. Hartke, James J. Hjerpe Kaskade, and Carl E. Hoge, filed Feb. 16, 2001;

Application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000, which claims priority to the following U.S. Provisional Patent Applications:

Application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999, now issued as U.S. Pat. No. 6,356,448, which is a continuation-in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450, and which claims priority to the following U.S. Provisional Patent Applications:

Application Serial No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Serial No. 60/219,506, entitled "HIGH PERFORMANCE THERMAL MECHANICAL INTERFACE," by Wendell C. Johnson, David H. Hartke and Joseph T. DiBene II, filed Jul. 20, 2000;

Application Serial No. 60/219,813, entitled "HIGH-CURRENT MICROPROCESSOR POWER DELIVERY SYSTEMS," by Joseph T. DiBene II, filed Jul. 21, 2000;

Application Serial No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Serial No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000; and Application Serial No. 60/232,971, entitled "INTEGRATED POWER DISTRIBUTION AND SEMICONDUCTOR PACKAGE," by Joseph T. DiBene II and James J. Hjerpe, filed Sep. 14, 2000;

Application Serial No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Serial No. 60/251,223, entitled "MICRO I-PAK FOR POWER DELIVERY TO MICROELECTRONICS," by Joseph T. DiBene II and Carl E. Hoge, filed Dec. 4, 2000;

Application Serial No. 60/251,184, entitled "MICROPROCESSOR INTEGRATED PACKAGING," by Joseph T. DiBene II, filed Dec. 4, 2000; and Application Serial No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, and Joseph T. DiBene II, filed Feb. 6, 2001; and Application Serial No. 60/277,369, entitled "THERMAL-MECHANICAL MEASUREMENT AND ANALYSIS OF AN ADVANCED THERMAL INTERFACE MATERIAL CONSTRUCTION," by Farhad Raiszadeh and Edward J. Derian, filed Mar. 19, 2001;

Application Serial No. 60/287,860, entitled "POWER TRANSMISSION DEVICE," by Joseph T. DiBene II, David H. Hartke, Carl E. Hoge, and Edward J. Derian, filed May 1, 2001;

Application Serial No. 60/291,749, entitled "MICRO I-PAK ARCHITECTURE HAVING A FLEXIBLE CONNECTOR BETWEEN A VOLTAGE REGULATION MODULE AND SUBSTRATE," by Joseph T. DiBene II, filed May 16, 2001;

Application Serial No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

Application Serial No. 60/292,125, entitled "VORTEX HEAT SINK FOR LOW PRESSURE DROP HIGH PERFORMANCE THERMAL MANAGEMENT ELECTRONIC ASSEMBLY SOLUTIONS," by Joseph T. DiBene II and Farhad Raiszadeh, filed May 18, 2001;

Application Serial No. 60/299,573, entitled "MICRO I-PAK STACK UP ARCHITECTURE," by Joseph T. DiBene II, Carl E. Hoge, and David H. Hartke, filed Jun. 19, 2001;

Application Serial No. 60/301,753, entitled "INTEGRATED POWER DELIVERY USING HIGH PERFORMANCE LINEAR REGULATORS ON PACKAGE WITH A MICROPROCESSOR," by Joseph T. DiBene II, Carl E. Hoge, and David H. Hartke, filed Jun. 27, 2001;

Application Serial No. 60/304,929, entitled "BORREGO ARCHITECTURE," by David H. Hartke and Joseph T. DiBene II, filed Jul. 11, 2001;

Application Serial No. 60/304,930, entitled "MICRO I-PAK," by Joseph T. DiBene II, Carl E. Hoge, David H. Hartke, and Edward J. Derian, filed Jul. 11, 2001;

Application Ser. No. 09/818,173, entitled "INTER-CIRCUIT ENCAPSULATED PACKAGING," by David H. Hartke and Joseph T. DiBene II, filed Mar. 26, 2001, now abandoned, which is a continuation in part of the following patent applications:

Application Ser. No. 09/801,437, entitled "METHOD AND APPARATUS FOR DELIVERING POWER TO HIGH PERFORMANCE ELECTRONIC ASSEMBLIES" by Joseph T. DiBene II, David H. Hartke, Carl E. Hoge, James M. Broder, Edward J. Derian, Joseph S. Riel, and Jose B. San Andres, filed Mar. 8, 2001;

Application Ser. No. 09/802,329, entitled "METHOD AND APPARATUS FOR THERMAL AND MECHANICAL MANAGEMENT OF A POWER REGULATOR MODULE AND MICROPROCESSOR IN CONTACT WITH A THERMALLY CONDUCTING PLATE" by Joseph T. DiBene II and David H. Hartke, filed Mar. 8, 2001;

Application Ser. No. 09/798,541, entitled "THERMAL/MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001, which is a continuation-in-part of application Ser. No. 09/727,016, entitled "EMI CONTAINMENT USING INTER-CIRCUIT ENCAPSULATED PACKAGING TECHNOLOGY," by Joseph T. DiBene II and David H. Hartke, filed Nov. 28, 2000, and a continuation-in-part of application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II and David H. Hartke, filed Feb. 16, 2001, and a continuation in part of application Ser. No. 09/432,878, entitled "INTER-CIRCUIT ENCAPSULATED PACKAGING FOR POWER DELIVERY", by Joseph T. DiBene II and David H. Hartke, filed Nov. 2, 1999, now issued as U.S. Pat. No. 6,356,448, which is a continuation in part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450;

Application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II, David H. Hartke, James J. Hjerpe Kaskade, and Carl E. Hoge, filed Feb. 16, 2001;

Application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000;

Application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999, now issued as U.S. Pat. No. 6,356,448, which is a continuation-in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450, and which claims priority to the following U.S. Provisional Patent Applications:

Application Serial No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Serial No. 60/196,059, entitled "EMI FRAME WITH POWER FEED-THROUGH AND THERMAL INTERFACE MATERIAL IN AN AGGREGATE DIAMOND MIXTURE," by Joseph T. DiBene II and David H. Hartke, filed Apr. 10, 2000;

Application Serial No. 60/219,813, entitled "HIGH-CURRENT MICROPROCESSOR POWER DELIVERY SYSTEMS," by Joseph T. DiBene II, filed Jul. 21, 2000;

Application Serial No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Serial No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000; and Application Serial No. 60/232,971, entitled "INTEGRATED POWER DISTRIBUTION AND SEMICONDUCTOR PACKAGE," by Joseph T. DiBene II and James J. Hjerpe, filed Sep. 14, 2000;

Application Serial No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Serial No. 60/251,223, entitled "MICRO I-PAK FOR POWER DELIVERY TO MICROELECTRONICS," by Joseph T. DiBene II and Carl E. Hoge, filed Dec. 4, 2000;

Application Serial No. 60/251,184, entitled "MICROPROCESSOR INTEGRATED PACKAGING," by Joseph T. DiBene II, filed Dec. 4, 2000; and Application Serial No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, and Joseph T. DiBene II, filed Feb. 6, 2001; and Application Serial No. 60/277,369, entitled "THERMAL-MECHANICAL MEASUREMENT AND ANALYSIS OF AN ADVANCED THERMAL INTERFACE MATERIAL CONSTRUCTION," by Farhad Raiszadeh and Edward J. Derian, filed Mar. 19, 2001;

Application Serial No. 60/287,860, entitled "POWER TRANSMISSION DEVICE," by Joseph T. DiBene II, David H. Hartke, Carl E. Hoge, and Edward J. Derian, filed May 1, 2001;

Application Serial No. 60/291,749, entitled "MICRO I-PAK ARCHITECTURE HAVING A FLEXIBLE CONNECTOR BETWEEN A VOLTAGE REGULATION MODULE AND A SUBSTRATE," by Joseph T. DiBene II, filed May 16, 2001;

Application Serial No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

Application Serial No. 60/292,125, entitled "VORTEX HEATSINK FOR LOW PRESSURE DROP HIGH PERFORMANCE THERMAL MANAGEMENT ELECTRONIC ASSEMBLY SOLUTIONS," by Joseph T. DiBene II and Farhad Raiszadeh, filed May 18, 2001;

Application Serial No. 60/299,573, entitled "MICRO I-PAK STACK UP ARCHITECTURE," by Joseph T. DiBene II, Carl E. Hoge, and David H. Hartke, filed Jun. 19, 2001;

Application Serial No. 60/301,753, entitled "INTEGRATED POWER DELIVERY USING HIGH PERFORMANCE LINEAR REGULATORS ON PACKAGE WITH A MICROPROCESSOR," by Joseph T. DiBene II, Carl E. Hoge, and David H. Hartke, filed Jun. 27, 2001;

Application Serial No. 60/304,929, entitled "BORREGO ARCHITECTURE," by David H. Hartke and Joseph T. DiBene II, filed Jul. 11, 2001;

Application Serial No. 60/304,930, entitled "MICRO I-PAK," by Joseph T. DiBene II, Carl E. Hoge, David H. Hartke, and Edward J. Derian, filed Jul. 11, 2001;

Application Ser. No. 09/921,153 entitled "VAPOR CHAMBER WITH INTEGRATED PIN ARRAY", by Joseph T. DiBene, II and Farhad Raiszadeh, filed on Aug. 2, 2001, now U.S. Pat. No. 6,490,160, which is a continuation in part of the following patent applications:

Application Ser. No. 09/921,152, entitled "HIGH SPEED AND HIGH DENSITY CIRCULAR CONNECTOR FOR BOARD-TO-BOARD INTERCONNECT SYSTEMS," by David H. Hartke and Joseph T. DiBene II, filed Aug. 2, 2001, now U.S. Pat. No. 6,604,914;

Application Ser. No. 09/910,524, entitled "HIGH PERFORMANCE THERMAL/MECHANICAL INTERFACE FOR FIXED-GAP REFERENCES FOR HIGH HEAT FLUX AND POWER SEMICONDUCTOR APPLICATIONS", by Joseph T. DiBene, II, David H. Hartke, Wendell C. Johnson, Farhad Raiszadeh, Edward J. Darien, and Jose B. San Andres, filed Jul. 20, 2001 now abandoned;

Application Ser. No. 09/801,437, entitled "METHOD AND APPARATUS FOR DELIVERING POWER TO HIGH PERFORMANCE ELECTRONIC ASSEMBLIES" by Joseph T. DiBene II, David H. Hartke, Carl E. Hoge, James M. Broder, Edward J. Derian, Joseph S. Riel, and Jose B. San Andres, filed Mar. 8, 2001;

Application Ser. No. 09/802,329, entitled "METHOD AND APPARATUS FOR THERMAL AND MECHANICAL MANAGEMENT OF A POWER REGULATOR MODULE AND MICROPROCESSOR IN CONTACT WITH A THERMALLY CONDUCTING PLATE" by Joseph T. DiBene II and David H. Hartke, filed Mar. 8, 2001;

Application Ser. No. 09/798,541, entitled "THERMAL/MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001, which is a continuation-in-part of application Ser. No. 09/727,016, entitled "EMI CONTAINMENT USING INTER-CIRCUIT ENCAPSULATED PACKAGING TECHNOLOGY," by Joseph T. DiBene II and David H. Hartke, filed Nov. 28, 2000, and a continuation-in-part of application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II and David H. Hartke, filed Feb. 16, 2001, and a continuation in part of application Ser. No. 09/432,878, entitled "INTER-CIRCUIT ENCAPSULATED PACKAGING FOR POWER DELIVERY", by Joseph T. DiBene II and David H. Hartke, filed Nov. 2, 1999, now issued as U.S. Pat. No. 6,356,448, which is a continuation in part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450;

Application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II, David H. Hartke, James J. Hjerpe Kaskade, and Carl E. Hoge, filed Feb. 16, 2001;

Application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000;

Application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999, now issued as U.S. Pat. No. 6,356,448, which is a continuation-in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450, and which claims priority to the following U.S. Provisional Patent Applications:

Application Serial No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Serial No. 60/196,059, entitled "EMI FRAME WITH POWER FEED-THROUGH AND THERMAL INTERFACE MATERIAL IN AN AGGREGATE DIAMOND MIXTURE," by Joseph T. DiBene II and David H. Hartke, filed Apr. 10, 2000;

Application Serial No. 60/219,813, entitled "HIGH-CURRENT MICROPROCESSOR POWER DELIVERY SYSTEMS," by Joseph T. DiBene II, filed Jul. 21, 2000;

Application Serial No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Serial No. 60/222,407, entitled "VAPOR HEAT-SINK COMBINATION FOR HIGH EFFICIENCY THERMAL MANAGEMENT," by David H. Hartke and Joseph T. DiBene II, filed Aug. 2, 2000; and Application Serial No. 60/232,971, entitled "INTEGRATED POWER DISTRIBUTION AND SEMICONDUCTOR PACKAGE," by Joseph T. DiBene II and James J. Hjerpe, filed Sep. 14, 2000;

Application Serial No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Serial No. 60/251,223, entitled "MICRO I-PAK FOR POWER DELIVERY TO MICROELECTRONICS," by Joseph T. DiBene II and Carl E. Hoge, filed Dec. 4, 2000;

Application Serial No. 60/251,184, entitled "MICROPROCESSOR INTEGRATED PACKAGING," by Joseph T. DiBene II, filed Dec. 4, 2000; and Application Serial No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, and Joseph T. DiBene II, filed Feb. 6, 2001; and Application Serial No. 60/277,369, entitled "THERMAL-MECHANICAL MEASUREMENT AND ANALYSIS OF AN ADVANCED THERMAL INTERFACE MATERIAL CONSTRUCTION," by Farhad Raiszadeh and Edward J. Derian, filed Mar. 19, 2001;

Application Serial No. 60/287,860, entitled "POWER TRANSMISSION DEVICE," by Joseph T. DiBene II, David H. Hartke, Carl E. Hoge, and Edward J. Derian, filed May 1, 2001;

Application Serial No. 60/291,749, entitled "MICRO I-PAK ARCHITECTURE HAVING A FLEXIBLE CONNECTOR BETWEEN A VOLTAGE REGULATION MODULE AND SUBSTRATE," by Joseph T. DiBene II, filed May 16, 2001;

Application Serial No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

Application Serial No. 60/292,125, entitled "VORTEX HEAT SINK FOR LOW PRESSURE DROP HIGH PERFORMANCE THERMAL MANAGEMENT ELECTRONIC ASSEMBLY SOLUTIONS," by Joseph T. DiBene II and Farhad Raiszadeh, filed May 18, 2001;

Application Serial No. 60/299,573, entitled "MICRO I-PAK STACK UP ARCHITECTURE," by Joseph T. DiBene II, Carl E. Hoge, and David H. Hartke, filed Jun. 19, 2001;

Application Serial No. 60/301,753, entitled "INTEGRATED POWER DELIVERY USING HIGH PERFORMANCE LINEAR REGULATORS ON PACKAGE WITH A MICROPROCESSOR," by Joseph T. DiBene II, Carl E. Hoge, and David H. Hartke, filed Jun. 27, 2001;

Application Serial No. 60/304,929, entitled "BORREGO ARCHITECTURE," by David H. Hartke and Joseph T. DiBene II, filed Jul. 11, 2001;

Application Serial No. 60/304,930, entitled "MICRO I-PAK," by Joseph T. DiBene II, Carl E. Hoge, David H. Hartke, and Edward J. Derian, filed Jul. 11, 2001; and Application Ser. No. 09/921,152, entitled "HIGH SPEED AND DENSITY CIRCULAR CONNECTOR FOR BOARD-TO-BOARD INTERCONNECTION SYSTEMS," by David H. Hartke and Joseph T. DiBene II, filed on Aug. 2, 2001, which is a continuation in part of the following patent applications:

Application Ser. No. 09/921,153 entitled "VAPOR CHAMBER WITH INTEGRATED PIN ARRAY", by Joseph T. DiBene II and Farhad Raiszadeh, filed on Aug. 2, 2001;

Application Ser. No. 09/910,524, entitled "HIGH PERFORMANCE THERMAL/MECHANICAL INTERFACE FOR FIXED-GAP REFERENCES FOR HIGH HEAT FLUX AND POWER SEMICONDUCTOR APPLICATIONS", by Joseph T. DiBene II, David H. Hartke, Wendell C. Johnson, Farhad Raiszadeh, Edward J. Darien, and Jose B. San Andres, filed Jul. 20, 2001;

Application Ser. No. 09/801,437, entitled "METHOD AND APPARATUS FOR DELIVERING POWER TO HIGH PERFORMANCE ELECTRONIC ASSEMBLIES" by Joseph T. DiBene II, David H. Hartke, Carl E. Hoge, James M. Broder, Edward J. Derian, Joseph S. Riel, and Jose B. San Andres, filed Mar. 8, 2001;

Application Ser. No. 09/802,329, entitled "METHOD AND APPARATUS FOR THERMAL AND MECHANICAL MANAGEMENT OF A POWER REGULATOR MODULE AND MICROPROCESSOR IN CONTACT WITH A THERMALLY CONDUCTING PLATE" by Joseph T. DiBene II and David H. Hartke, filed Mar. 8, 2001;

Application Ser. No. 09/798,541, entitled "THERMAL/MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001, which is a continuation-in-part of application Ser. No. 09/727,016, entitled "EMI CONTAINMENT USING INTER-CIRCUIT ENCAPSULATED PACKAGING TECHNOLOGY," by Joseph T. DiBene II and David H. Hartke, filed Nov. 28, 2000, and a continuation-in-part of application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II and David H. Hartke, filed Feb. 16, 2001, and a continuation in part of application Ser. No. 09/432,878, entitled "INTER-CIRCUIT ENCAPSULATED PACKAGING FOR POWER DELIVERY", by Joseph T. DiBene II and David H. Hartke, filed Nov. 2, 1999, now issued as U.S. Pat. No. 6,356,448, which is a continuation in part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450;

Application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II, David H. Hartke, James J. Hjerpe Kaskade, and Carl E. Hoge, filed Feb. 16, 2001;

Application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000;

Application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999, now issued as U.S. Pat. No. 6,356,448, which is a continuation-in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450;

and which claims priority to the following U.S. Provisional Patent Applications:

Application Serial No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Serial No. 60/196,059, entitled "EMI FRAME WITH POWER FEED-THROUGH AND THERMAL INTERFACE MATERIAL IN AN AGGREGATE DIAMOND MIXTURE," by Joseph T. DiBene II and David H. Hartke, filed Apr. 10, 2000;

Application Serial No. 60/219,813, entitled "HIGH-CURRENT MICROPROCESSOR POWER DELIVERY SYSTEMS," by Joseph T. DiBene II, filed Jul. 21, 2000;

Application Serial No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Serial No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000; and Application Serial No. 60/232,971, entitled "INTEGRATED POWER DISTRIBUTION AND SEMICONDUCTOR PACKAGE," by Joseph T. DiBene II and James J. Hjerpe, filed Sep. 14, 2000;

Application Serial No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Serial No. 60/251,223, entitled "MICRO I-PAK FOR POWER DELIVERY TO

MICROELECTRONICS," by Joseph T. DiBene II and Carl E. Hoge, filed Dec. 4, 2000;

Application Serial No. 60/251,184, entitled "MICROPROCESSOR INTEGRATED PACKAGING," by Joseph T. DiBene II, filed Dec. 4, 2000; and Application Serial No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, and Joseph T. DiBene II, filed Feb. 6, 2001; and Application Serial No. 60/277,369, entitled "THERMAL-MECHANICAL MEASUREMENT AND ANALYSIS OF AN ADVANCED THERMAL INTERFACE MATERIAL CONSTRUCTION," by Farhad Raiszadeh and Edward J. Derian, filed Mar. 19, 2001;

Application Serial No. 60/287,860, entitled "POWER TRANSMISSION DEVICE," by Joseph T. DiBene II, David H. Hartke, Carl E. Hoge, and Edward J. Derian, filed May 1, 2001;

Application Serial No. 60/291,749, entitled "MICRO I-PAK ARCHITECTURE HAVING A FLEXIBLE CONNECTOR BETWEEN A VOLTAGE REGULATION MODULE AND SUBSTRATE," by Joseph T. DiBene II, filed May 16, 2001;

Application Serial No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

Application Serial No. 60/292,125, entitled "VORTEX HEAT SINK FOR LOW PRESSURE DROP HIGH PERFORMANCE THERMAL MANAGEMENT ELECTRONIC ASSEMBLY SOLUTIONS," by Joseph T. DiBene II and Farhad Raiszadeh, filed May 18, 2001;

Application Serial No. 60/299,573, entitled "MICRO I-PAK STACK UP ARCHITECTURE," by Joseph T. DiBene II, Carl E. Hoge, and David H. Hartke, filed Jun. 19, 2001;

Application Serial No. 60/301,753, entitled "INTEGRATED POWER DELIVERY USING HIGH PERFORMANCE LINEAR REGULATORS ON PACKAGE WITH A MICROPROCESSOR," by Joseph T. DiBene II, Carl E. Hoge, and David H. Hartke, filed Jun. 27, 2001;

Application Serial No. 60/304,929, entitled "BORREGO ARCHITECTURE," by David H. Hartke and Joseph T. DiBene II, filed Jul. 11, 2001;

Application Serial No. 60/304,930, entitled "MICRO I-PAK," by Joseph T. DiBene II, Carl E. Hoge, David H. Hartke, and Edward J. Derian, filed Jul. 11, 2001; and U.S. patent application Ser. No. 10/036,957, entitled "ULTRA-LOW IMPEDANCE POWER INTERCONNECTION SYSTEM FOR ELECTRONIC PACKAGES," by Joseph T. DiBene II, David H. Hartke, Carl E. Hoge, and Edward J. Derian, filed Dec. 20, 2001, which claims benefit of the following provisional patent applications, which are hereby incorporated by reference herein:

Application Serial No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by Joseph T. DiBene II, David H. Hartke, and James M. Broder, filed Feb. 6, 2001;

Application Serial No. 60/277,369, entitled "THERMAL-MECHANICAL MEASUREMENT AND ANALYSIS OF ADVANCED THERMAL INTERFACE MATERIAL CONSTRUCTION," by Joseph T. DiBene II, David H. Hartke and Farhad Raiszadeh, filed Mar. 19, 2001;

Application Serial No. 60/287,860, entitled "POWER TRANSMISSION DEVICE," by Joseph T. DiBene II, David H. Hartke, Carl E. Hoge, and Edward J. Derian, filed May 1, 2001;

Application Serial No. 60/291,749, entitled "MICRO I-PAK ARCHITECTURE HAVING A FLEXIBLE CONNECTOR BETWEEN A VOLTAGE REGULATION MODULE AND SUBSTRATE," by Joseph T. DiBene II, filed May 16, 2001;

Application Serial No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

Application Serial No. 60/292,125, entitled "VORTEX HEATSINK FOR LOW PRESSURE DROP HIGH PERFORMANCE THERMAL MANAGEMENT ELECTRONIC ASSEMBLY SOLUTIONS," by Joseph T. DiBene II, and Farhad Raiszadeh, filed May 18, 2001;

Application Serial No. 60/299,573, entitled "IMPROVED MICRO-I-PAK STACK-UP ARCHITECTURE," by Joseph T. DiBene, Carl E. Hoge, and David H. Hartke, filed Jun. 19, 2001;

Application Serial No. 60/301,753, entitled "INTEGRATED POWER DELIVERY USING HIGH PERFORMANCE LINEAR REGULATORS ON PACKAGE WITH A MICROPROCESSOR," by Joseph T. DiBene II, Carl E. Hoge, and David H. Hartke, filed Jun. 27, 2001;

Application Serial No. 60/304,929, entitled "BORREGO ARCHITECTURE," by David H. Hartke and Joseph T. DiBene II, filed Jul. 11, 2001;

Application Serial No. 60/304,930, entitled "MICRO-I-PAK," by Joseph T. DiBene II, Carl E. Hoge, David H. Hartke, and Edward J. Derian, filed Jul. 11, 2001;

Application Serial No. 60/310,038, entitled "TOOLLESS CONCEPTS FOR BORREGO," by Edward J. Derian and Joseph T. DiBene II, filed Aug. 3, 2001;

Application Serial No. 60/313,338, entitled "TOOLLESS PRISM IPA ASSEMBLY TO SUPPORT IA64 MCKINLEY MICROPROCESSOR," by David H. Hartke and Edward J. Derian, filed Aug. 17, 2001; and Application Serial No. 60/338,004, entitled "MICRO-SPRING CONFIGURATIONS FOR POWER DELIVERY FROM VOLTAGE REGULATOR MODULES TO INTEGRATED CIRCUITS AND MICROPROCESSORS," by Joseph T. DiBene II, David H. Hartke, Carl E. Hoge, and Edward J. Derian, filed Nov. 8, 2001;

and which patent application is also continuation-in-part of the following co-pending and commonly assigned patent applications, each of which applications are hereby incorporated by reference herein:

Application Ser. No. 09/885,780, entitled "INTER-CIRCUIT ENCAPSULATED PACKAGING," by Joseph T. DiBene II and David H. Hartke, filed Jun. 19, 2001, which is a continuation in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450;

Application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999, now issued as U.S. Pat. No. 6,356,448, which is a continuation-in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450;

Application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000, which claims priority to the following U.S. Provisional Patent Applications:

Application Serial No. 60/167,792, entitled "EMI CONTAINMENT USING INTER-CIRCUIT ENCAPSULATED PACKAGING TECHNOLOGY," by Joseph T. DiBene II and David H. Hartke, filed Nov. 29, 1999;

Application Serial No. 60/171,065, entitled "INTER-CIRCUIT ENCAPSULATED PACKAGING TECHNOLOGY," by Joseph T. DiBene II and David H. Hartke, filed Dec. 16, 1999;

Application Serial No. 60/183,474, entitled "DIRECT ATTACH POWER/THERMAL WITH INCEP," by Joseph T. DiBene II and David H. Hartke, filed Feb. 18, 2000;

Application Serial No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Serial No. 60/196,059, entitled "EMI FRAME WITH POWER FEED-THROUGH AND THERMAL INTERFACE MATERIAL IN AN AGGREGATE DIAMOND MIXTURE," by Joseph T. DiBene II and David H. Hartke, filed Apr. 10, 2000;

Application Serial No. 60/219,506, entitled "HIGH PERFORMANCE THERMAL MECHANICAL INTERFACE," by Wendell C. Johnson, David H. Hartke and Joseph T. DiBene II, filed Jul. 20, 2000;

Application Serial No. 60/219,813, entitled "HIGH-CURRENT MICROPROCESSOR POWER DELIVERY SYSTEMS," by Joseph T. DiBene II, filed Jul. 21, 2000;

Application Serial No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Serial No. 60/222,407, entitled "VAPOR HEAT SINK COMBINATION FOR HIGH EFFICIENCY THERMAL MANAGEMENT," by David H. Hartke and Joseph T. DiBene II, filed Aug. 2, 2000; and Application Serial No. 60/232,971, entitled "INTEGRATED POWER DISTRIBUTION AND SEMICONDUCTOR PACKAGE," by Joseph T. DiBene II, and James J. Hjerpe, filed Sep. 14, 2000;

Application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II, David H. Hartke, James J. Hjerpe Kaskade, and Carl E. Hoge, filed Feb. 16, 2001, which claims priority to the following Provisional Patent Applications;

Application Serial No. 60/183,474, entitled "DIRECT ATTACH POWER/THERMAL WITH INCEP," by Joseph T. DiBene II and David H. Hartke, filed Feb. 18, 2000;

Application Serial No. 60/186,769, entitled "THERMACEP SPRING BEAM," by Joseph T. DiBene II and David H. Hartke, filed Mar. 3, 2000;

Application Serial No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Serial No. 60/196,059, entitled "EMI FRAME WITH POWER FEED-THROUGH AND THERMAL INTERFACE MATERIAL IN AN AGGREGATE DIAMOND MIXTURE," by Joseph T. DiBene II and David H. Hartke, filed Apr. 10, 2000;

Application Serial No. 60/219,506, entitled "HIGH PERFORMANCE THERMAL MECHANICAL INTERFACE," by Wendell C. Johnson, David H. Hartke and Joseph T. DiBene II, filed Jul. 20, 2000;

Application Serial No. 60/219,813, entitled "HIGH-CURRENT MICROPROCESSOR POWER DELIVERY SYSTEMS," by Joseph T. DiBene II, filed Jul. 21, 2000;

Application Serial No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Serial No. 60/222,407, entitled "VAPOR HEAT SINK COMBINATION FOR HIGH EFFICIENCY THERMAL MANAGEMENT," by David H. Hartke and Joseph T. DiBene II, filed Aug. 2, 2000; and Application Serial No. 60/232,971, entitled "INTEGRATED POWER DISTRIBUTION AND SEMICONDUCTOR PACKAGE," by Joseph T. DiBene II, and James J. Hjerpe, filed Sep. 14, 2000;

Application Serial No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Serial No. 60/251,223, entitled "MICRO I-PAK FOR POWER DELIVERY TO MICROELECTRONICS," by Joseph T. DiBene II and Carl E. Hoge, filed Dec. 4, 2000;

Application Serial No. 60/251,184, entitled "MICROPROCESSOR INTEGRATED PACKAGING," by Joseph T. DiBene II, filed Dec. 4, 2000; and Application Serial No. 60/266,941, entitled "MECHANICAL INTERCONNECTION TECHNOLOGIES USING FLEX CABLE INTERCONNECT FOR DELIVERY IN 'INCEP' INTEGRATED ARCHITECTURE," by David H. Hartke, James M. Broder, and Joseph T. DiBene II, filed Feb. 6, 2001; and Application Ser. No. 09/798,541, entitled "THERMAL/MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001, which is a continuation-in-part of application Ser. No. 09/727,016, entitled "EMI CONTAINMENT USING INTER-CIRCUIT ENCAPSULATED PACKAGING TECHNOLOGY," by Joseph T. DiBene II and David H. Hartke, filed Nov. 28, 2000, and a continuation-in-part of application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II and David H. Hartke, filed Feb. 16, 2001, and a continuation in part of application Ser. No. 09/432,878, entitled "INTER-CIRCUIT ENCAPSULATED PACKAGING FOR POWER DELIVERY", by Joseph T. DiBene II and David H. Hartke, filed Nov. 2, 1999, now issued as U.S. Pat. No. 6,356,448, which is a continuation in part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450, and which claims priority to the following U.S. Provisional Patent Applications:

Application Serial No. 60/183,474, entitled "DIRECT ATTACH POWER/THERMAL WITH INCEP," by Joseph T. DiBene II and David H. Hartke, filed Feb. 18, 2000;

Application Serial No. 60/186,769, entitled "THERMACEP SPRING BEAM," by Joseph T. DiBene II and David H. Hartke, filed Mar. 3, 2000;

Application Serial No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Serial No. 60/196,059, entitled "EMI FRAME WITH POWER FEED-THROUGH AND THERMAL INTERFACE MATERIAL IN AN AGGREGATE DIAMOND MIXTURE," by Joseph T. DiBene II and David H. Hartke, filed Apr. 10, 2000;

Application Serial No. 60/219,506, entitled "HIGH PERFORMANCE THERMAL MECHANICAL INTERFACE," by Wendell C. Johnson, David H. Hartke and Joseph T. DiBene II, filed Jul. 20, 2000;

Application Serial No. 60/219,813, entitled "HIGH-CURRENT MICROPROCESSOR POWER DELIVERY SYSTEMS," by Joseph T. DiBene II, filed Jul. 21, 2000;

Application Serial No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Serial No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000; and Application Serial No. 60/232,971, entitled "INTEGRATED POWER DISTRIBUTION AND SEMICONDUCTOR PACKAGE," by Joseph T. DiBene II, and James J. Hjerpe, filed Sep. 14, 2000;

Application Serial No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Serial No. 60/251,223, entitled "MICRO I-PAK FOR POWER DELIVERY TO MICROELECTRONICS," by Joseph T. DiBene II and Carl E. Hoge, filed Dec. 4, 2000;

Application Serial No. 60/251,184, entitled "MICROPROCESSOR INTEGRATED PACKAGING," by Joseph T. DiBene II, filed Dec. 4, 2000; and Application Serial No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, and Joseph T. DiBene II, filed Feb. 6, 2001; and Application Ser. No. 09/801,437, entitled "METHOD AND APPARATUS FOR DELIVERING POWER TO HIGH PERFORMANCE ELECTRONIC ASSEMBLIES" by Joseph T. DiBene II, David H. Hartke, Carl E. Hoge, James M. Broder, Edward J. Derian, Joseph S. Riel, and Jose B. San Andres, filed Mar. 8, 2001, which is a continuation in part of the following patent applications:

Application Ser. No. 09/798,541, entitled "THERMAL/MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001;

Application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II, David H. Hartke, James J. Hjerpe Kaskade, and Carl E. Hoge, filed Feb. 16, 2001;

Application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000;

Application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999, now issued as U.S. Pat. No. 6,356,448, which is a continuation-in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450;

and which claims priority to the following U.S. Provisional Patent Applications:

Application Serial No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Serial No. 60/196,059, entitled "EMI FRAME WITH POWER FEED-THROUGH AND THERMAL INTERFACE MATERIAL IN AN AGGREGATE DIAMOND MIXTURE," by Joseph T. DiBene II and David H. Hartke, filed Apr. 10, 2000;

Application Serial No. 60/219,813, entitled "HIGH-CURRENT MICROPROCESSOR POWER DELIVERY SYSTEMS," by Joseph T. DiBene II, filed Jul. 21, 2000;

Application Serial No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Serial No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000; and Application Serial No. 60/232,971, entitled "INTEGRATED POWER DISTRIBUTION AND SEMICONDUCTOR PACKAGE," by Joseph T. DiBene II, and James J. Hjerpe, filed Sep. 14, 2000;

Application Serial No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Serial No. 60/251,223, entitled "MICRO I-PAK FOR POWER DELIVERY TO MICROELECTRONICS," by Joseph T. DiBene II and Carl E. Hoge, filed Dec. 4, 2000;

Application Serial No. 60/251,184, entitled "MICROPROCESSOR INTEGRATED PACKAGING," by Joseph T. DiBene II, filed Dec. 4, 2000; and Application Serial No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, and Joseph T. DiBene II, filed Feb. 6, 2001; and Application Ser. No. 09/802,329, entitled "METHOD AND APPARATUS FOR THERMAL AND MECHANICAL MANAGEMENT OF A POWER REGULATOR MODULE AND MICROPROCESSOR IN CONTACT WITH A THERMALLY CONDUCTING PLATE" by Joseph T. DiBene II and David H. Hartke, filed Mar. 8, 2001, which is a continuation in part of the following patent applications:

Application Ser. No. 09/798,541, entitled "THERMAL/MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001, which is a continuation-in-part of application Ser. No. 09/727,016, entitled "EMI CONTAINMENT USING INTER-CIRCUIT ENCAPSULATED PACKAGING TECHNOLOGY," by Joseph T. DiBene II and David H. Hartke, filed Nov. 28, 2000, and a continuation-in-part of application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II and David H. Hartke, filed Feb. 16, 2001, and a continuation in part of application Ser. No. 09/432,878, entitled "INTER-CIRCUIT ENCAPSULATED PACKAGING FOR POWER DELIVERY", by Joseph T. DiBene II and David H. Hartke, filed Nov. 2, 1999, now issued as U.S. Pat. No. 6,356,448, which is a continuation in part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450;

Application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II, David H. Hartke, James J. Hjerpe Kaskade, and Carl E. Hoge, filed Feb. 16, 2001;

Application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000;

Application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999, now issued as U.S. Pat. No. 6,356,448, which is a continuation-in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450, and which claims priority to the following U.S. Provisional Patent Applications:

Application Serial No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Serial No. 60/196,059, entitled "EMI FRAME WITH POWER FEED-THROUGH AND THERMAL INTERFACE MATERIAL IN AN AGGREGATE DIAMOND MIXTURE," by Joseph T. DiBene II and David H. Hartke, filed Apr. 10, 2000;

Application Serial No. 60/219,813, entitled "HIGH-CURRENT MICROPROCESSOR POWER DELIVERY SYSTEMS," by Joseph T. DiBene II, filed Jul. 21, 2000;

Application Serial No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Serial No. 60/222,407, entitled "VAPOR HEAT-SINK COMBINATION FOR HIGH EFFICIENCY THERMAL MANAGEMENT," by David H. Hartke and Joseph T. DiBene II, filed Aug. 2, 2000; and Application Serial No. 60/232,971, entitled "INTEGRATED POWER DISTRIBUTION AND SEMICONDUCTOR PACKAGE," by Joseph T. DiBene II, and James J. Hjerpe, filed Sep. 14, 2000;

Application Serial No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Serial No. 60/251,223, entitled "MICRO I-PAK FOR POWER DELIVERY TO MICROELECTRONICS," by Joseph T. DiBene II and Carl E. Hoge, filed Dec. 4, 2000;

Application Serial No. 60/251,184, entitled "MICROPROCESSOR INTEGRATED PACKAGING," by Joseph T. DiBene II, filed Dec. 4, 2000; and Application Serial No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, and Joseph T. DiBene II, filed Feb. 6, 2001; and Application Ser. No. 09/910,524, entitled "HIGH PERFORMANCE THERMAL/MECHANICAL INTERFACE FOR FIXED-GAP REFERENCES FOR HIGH HEAT FLUX AND POWER SEMICONDUCTOR APPLICATIONS", by Joseph T. DiBene, II, David H. Hartke, Wendell C. Johnson, Farhad Raiszadeh, Edward J. Darien, and Jose B. San Andres, filed Jul. 20, 2001, which is a continuation in part of the following patent applications:

Application Ser. No. 09/801,437, entitled "METHOD AND APPARATUS FOR DELIVERING POWER TO HIGH PERFORMANCE ELECTRONIC ASSEMBLIES" by Joseph T. DiBene II, David H. Hartke, Carl E. Hoge, James M. Broder, Edward J. Derian, Joseph S. Riel, and Jose B. San Andres, filed Mar. 8, 2001;

Application Ser. No. 09/802,329, entitled "METHOD AND APPARATUS FOR THERMAL AND MECHANICAL MANAGEMENT OF A POWER REGULATOR MODULE AND MICROPROCESSOR IN CONTACT WITH A THERMALLY CONDUCTING PLATE" by Joseph T. DiBene II and David H. Hartke, filed Mar. 8, 2001;

Application Ser. No. 09/798,541, entitled "THERMAL/MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001;

Application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II, David H. Hartke, James J. Hjerpe Kaskade, and Carl E. Hoge, filed Feb. 16, 2001;

Application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000, which claims priority to the following U.S. Provisional Patent Applications;

Application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999, now issued as U.S. Pat. No. 6,356,448, which is a continuation-in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450, and which claims priority to the following U.S. Provisional Patent Applications:

Application Serial No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Serial No. 60/219,506, entitled "HIGH PERFORMANCE THERMAL MECHANICAL INTERFACE," by Wendell C. Johnson, David H. Hartke and Joseph T. DiBene II, filed Jul. 20, 2000;

Application Serial No. 60/219,813, entitled "HIGH-CURRENT MICROPROCESSOR POWER DELIVERY SYSTEMS," by Joseph T. DiBene II, filed Jul. 21, 2000;

Application Serial No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Serial No. 60/222,407, entitled "VAPOR HEATSINK COMBINATION FOR

HIGH EFFICIENCY THERMAL MANAGEMENT," by David H. Hartke and Joseph T. DiBene II, filed Aug. 2, 2000; and Application Serial No. 60/232,971, entitled "INTEGRATED POWER DISTRIBUTION AND SEMICONDUCTOR PACKAGE," by Joseph T. DiBene II, and James J. Hjerpe, filed Sep. 14, 2000;

Application Serial No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Serial No. 60/251,223, entitled "MICRO I-PAK FOR POWER DELIVERY TO MICROELECTRONICS," by Joseph T. DiBene II and Carl E. Hoge, filed Dec. 4, 2000;

Application Serial No. 60/251,184, entitled "MICROPROCESSOR INTEGRATED PACKAGING," by Joseph T. DiBene II, filed Dec. 4, 2000; and Application Serial No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, and Joseph T. DiBene II, filed Feb. 6, 2001; and Application Serial No. 60/277,369, entitled "THERMAL-MECHANICAL MEASUREMENT AND ANALYSIS OF AN ADVANCED THERMAL INTERFACE MATERIAL CONSTRUCTION," by Farhad Raiszadeh and Edward J. Derian, filed Mar. 19, 2001;

Application Serial No. 60/287,860, entitled "POWER TRANSMISSION DEVICE," by Joseph T. DiBene II, David H. Hartke, Carl E. Hoge, and Edward J. Derian, filed May 1, 2001;

Application Serial No. 60/291,749, entitled "MICRO I-PAK ARCHITECTURE HAVING A FLEXIBLE CONNECTOR BETWEEN A VOLTAGE REGULATION MODULE AND SUBSTRATE," by Joseph T. DiBene II, filed May 16, 2001;

Application Serial No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

Application Serial No. 60/292,125, entitled "VORTEX HEAT SINK FOR LOW PRESSURE DROP HIGH PERFORMANCE THERMAL MANAGEMENT ELECTRONIC ASSEMBLY SOLUTIONS," by Joseph T. DiBene II and Farhad Raiszadeh, filed May 18, 2001;

Application Serial No. 60/299,573, entitled "MICRO I-PAK STACK UP ARCHITECTURE," by Joseph T. DiBene II, Carl E. Hoge, and David H. Hartke, filed Jun. 19, 2001;

Application Serial No. 60/301,753, entitled "INTEGRATED POWER DELIVERY USING HIGH PERFORMANCE LINEAR REGULATORS ON PACKAGE WITH A MICROPROCESSOR," by Joseph T. DiBene II, Carl E. Hoge, and David H. Hartke, filed Jun. 27, 2001;

Application Serial No. 60/304,929, entitled "BORREGO ARCHITECTURE," by David H. Hartke and Joseph T. DiBene II, filed Jul. 11, 2001;

Application Serial No. 60/304,930, entitled "MICRO IPAK," by Joseph T. DiBene II, Carl E. Hoge, David H. Hartke, and Edward J. Derian, filed Jul. 11, 2001;

Application Ser. No. 09/818,173, entitled "INTER-CIRCUIT ENCAPSULATED PACKAGING," by David H. Hartke and Joseph T. DiBene II, filed Mar. 26, 2001, which is a continuation in part of the following patent applications:

Application Ser. No. 09/801,437, entitled "METHOD AND APPARATUS FOR DELIVERING POWER TO HIGH PERFORMANCE ELECTRONIC ASSEMBLIES" by Joseph T. DiBene II, David H. Hartke, Carl E. Hoge, James M. Broder, Edward J. Derian, Joseph S. Riel, and Jose B. San Andres, filed Mar. 8, 2001;

Application Ser. No. 09/802,329, entitled "METHOD AND APPARATUS FOR THERMAL AND MECHANICAL MANAGEMENT OF A POWER REGULATOR MODULE AND MICROPROCESSOR IN CONTACT WITH A THERMALLY CONDUCTING PLATE" by Joseph T. DiBene II and David H. Hartke, filed Mar. 8, 2001;

Application Ser. No. 09/798,541, entitled "THERMAL/MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001, which is a continuation-in-part of application Ser. No. 09/727,016, entitled "EMI CONTAINMENT USING INTER-CIRCUIT ENCAPSULATED PACKAGING TECHNOLOGY," by Joseph T. DiBene II and David H. Hartke, filed Nov. 28, 2000, and a continuation-in-part of application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II and David H. Hartke, filed Feb. 16, 2001, and a continuation in part of application Ser. No. 09/432,878, entitled "INTER-CIRCUIT ENCAPSULATED PACKAGING FOR POWER DELIVERY", by Joseph T. DiBene II and David H. Hartke, filed Nov. 2, 1999, now issued as U.S. Pat. No. 6,356,448, which is a continuation in part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450;

Application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II, David H. Hartke, James J. Hjerpe Kaskade, and Carl E. Hoge, filed Feb. 16, 2001;

Application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000;

Application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999, now issued as U.S. Pat. No. 6,356,448, which is a continuation-in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450, and which claims priority to the following U.S. Provisional Patent Applications:

Application Serial No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Serial No. 60/196,059, entitled "EMI FRAME WITH POWER FEED-THROUGH AND THERMAL INTERFACE MATERIAL IN AN AGGREGATE DIAMOND MIXTURE," by Joseph T. DiBene II and David H. Hartke, filed Apr. 10, 2000;

Application Serial No. 60/219,813, entitled "HIGH-CURRENT MICROPROCESSOR POWER DELIVERY SYSTEMS," by Joseph T. DiBene II, filed Jul. 21, 2000;

Application Serial No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Serial No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000; and Application Serial No. 60/232,971, entitled "INTEGRATED POWER DISTRIBUTION AND SEMICONDUCTOR PACKAGE," by Joseph T. DiBene II, and James J. Hjerpe, filed Sep. 14, 2000;

Application Serial No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Serial No. 60/251,223, entitled "MICRO I-PAK FOR POWER DELIVERY TO MICROELECTRONICS," by Joseph T. DiBene II and Carl E. Hoge, filed Dec. 4, 2000;

Application Serial No. 60/251,184, entitled "MICROPROCESSOR INTEGRATED PACKAGING," by Joseph T. DiBene II, filed Dec. 4, 2000; and Application Serial No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, and Joseph T. DiBene II, filed Feb. 6, 2001; and Application Serial No. 60/277,369, entitled "THERMAL-MECHANICAL MEASUREMENT AND ANALYSIS OF AN ADVANCED THERMAL INTERFACE MATERIAL CONSTRUCTION," by Farhad Raiszadeh and Edward J. Derian, filed Mar. 19, 2001;

Application Serial No. 60/287,860, entitled "POWER TRANSMISSION DEVICE," by Joseph T. DiBene II, David H. Hartke, Carl E. Hoge, and Edward J. Derian, filed May 1, 2001;

Application Serial No. 60/291,749, entitled "MICRO I-PAK ARCHITECTURE HAVING A FLEXIBLE CONNECTOR BETWEEN A VOLTAGE REGULATION MODULE AND A SUBSTRATE," by Joseph T. DiBene II, filed May 16, 2001;

Application Serial No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

Application Serial No. 60/292,125, entitled "VORTEX HEATSINK FOR LOW PRESSURE DROP HIGH PERFORMANCE THERMAL MANAGEMENT ELECTRONIC ASSEMBLY SOLUTIONS," by Joseph T. DiBene II and Farhad Raiszadeh, filed May 18, 2001;

Application Serial No. 60/299,573, entitled "MICRO I-PAK STACK UP ARCHITECTURE," by Joseph T. DiBene II, Carl E. Hoge, and David H. Hartke, filed Jun. 19, 2001;

Application Serial No. 60/301,753, entitled "INTEGRATED POWER DELIVERY USING HIGH PERFORMANCE LINEAR REGULATORS ON PACKAGE WITH A MICROPROCESSOR," by Joseph T. DiBene II, Carl E. Hoge, and David H. Hartke, filed Jun. 27, 2001;

Application Serial No. 60/304,929, entitled "BORREGO ARCHITECTURE," by David H. Hartke and Joseph T. DiBene II, filed Jul. 11, 2001;

Application Serial No. 60/304,930, entitled "MICRO IPAK," by Joseph T. DiBene II, Carl E. Hoge, David H. Hartke, and Edward J. Derian, filed Jul. 11, 2001;

Application Ser. No. 09/921,153 entitled "VAPOR CHAMBER WITH INTEGRATED PIN ARRAY", by Joseph T. DiBene, II and Farhad Raiszadeh, filed on Aug. 2, 2001, which is a continuation in part of the following patent applications:

Application Ser. No. 09/921,152, entitled "HIGH SPEED AND HIGH DENSITY CIRCULAR CONNECTOR FOR BOARD-TO-BOARD INTERCONNECT SYSTEMS," by David H. Hartke and Joseph T. DiBene II, filed Aug. 2, 2001;

Application Ser. No. 09/910,524, entitled "HIGH PERFORMANCE THERMAL/MECHANICAL INTERFACE FOR FIXED-GAP REFERENCES FOR HIGH HEAT FLUX AND POWER SEMICONDUCTOR APPLICATIONS", by Joseph T. DiBene, II, David H. Hartke, Wendell C. Johnson, Farhad Raiszadeh, Edward J. Darien, and Jose B. San Andres, filed Jul. 20, 2001;

Application Ser. No. 09/801,437, entitled "METHOD AND APPARATUS FOR DELIVERING POWER TO HIGH PERFORMANCE ELECTRONIC ASSEMBLIES" by Joseph T. DiBene II, David H. Hartke, Carl E. Hoge, James M. Broder, Edward J. Derian, Joseph S. Riel, and Jose B. San Andres, filed Mar. 8, 2001;

Application Ser. No. 09/802,329, entitled "METHOD AND APPARATUS FOR THERMAL AND MECHANICAL MANAGEMENT OF A POWER REGULATOR MODULE AND MICROPROCESSOR IN CONTACT WITH A THERMALLY CONDUCTING PLATE" by Joseph T. DiBene II and David H. Hartke, filed Mar. 8, 2001;

Application Ser. No. 09/798,541, entitled "THERMAL/MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001, which is a continuation-in-part of application Ser. No. 09/727,016, entitled "EMI CONTAINMENT USING INTER-CIRCUIT ENCAPSULATED PACKAGING TECHNOLOGY," by Joseph T. DiBene II and David H. Hartke, filed Nov. 28, 2000, and a continuation-in-part of application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II and David H. Hartke, filed Feb. 16, 2001, and a continuation in part of application Ser. No. 09/432,878, entitled "INTER-CIRCUIT ENCAPSULATED PACKAGING FOR POWER DELIVERY", by Joseph T. DiBene II and David H. Hartke, filed Nov. 2, 1999, now issued as U.S. Pat. No. 6,356,448, which is a continuation in part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450;

Application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II, David H. Hartke, James J. Hjerpe Kaskade, and Carl E. Hoge, filed Feb. 16, 2001;

Application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000;

Application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999, now issued as U.S. Pat. No. 6,356,448, which is a continuation-in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450, and which claims priority to the following U.S. Provisional Patent Applications:

Application Serial No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Serial No. 60/196,059, entitled "EMI FRAME WITH POWER FEED-THROUGH AND THERMAL INTERFACE MATERIAL IN AN AGGREGATE DIAMOND MIXTURE," by Joseph T. DiBene II and David H. Hartke, filed Apr. 10, 2000;

Application Serial No. 60/219,813, entitled "HIGH-CURRENT MICROPROCESSOR POWER DELIVERY SYSTEMS," by Joseph T. DiBene II, filed Jul. 21, 2000;

Application Serial No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Serial No. 60/222,407, entitled "VAPOR HEAT-SINK COMBINATION FOR HIGH EFFICIENCY THERMAL MANAGEMENT," by David H. Hartke and Joseph T. DiBene II, filed Aug. 2, 2000; and Application Serial No. 60/232,971, entitled "INTEGRATED POWER DISTRIBUTION AND SEMICONDUCTOR PACKAGE," by Joseph T. DiBene II, and James J. Hjerpe, filed Sep. 14, 2000;

Application Serial No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Serial No. 60/251,223, entitled "MICRO I-PAK FOR POWER DELIVERY TO MICROELECTRONICS," by Joseph T. DiBene II and Carl E. Hoge, filed Dec. 4, 2000;

Application Serial No. 60/251,184, entitled "MICROPROCESSOR INTEGRATED PACKAGING," by Joseph T. DiBene II, filed Dec. 4, 2000; and Application Serial No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, and Joseph T. DiBene II, filed Feb. 6, 2001; and Application Serial No. 60/277,369, entitled "THERMAL-MECHANICAL MEASUREMENT AND ANALYSIS OF AN ADVANCED THERMAL INTERFACE MATERIAL CONSTRUCTION," by Farhad Raiszadeh and Edward J. Derian, filed Mar. 19, 2001;

Application Serial No. 60/287,860, entitled "POWER TRANSMISSION DEVICE," by Joseph T. DiBene II, David H. Hartke, Carl E. Hoge, and Edward J. Derian, filed May 1, 2001;

Application Serial No. 60/291,749, entitled "MICRO I-PAK ARCHITECTURE HAVING A FLEXIBLE CONNECTOR BETWEEN A VOLTAGE REGULATION MODULE AND SUBSTRATE," by Joseph T. DiBene II, filed May 16, 2001;

Application Serial No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

Application Serial No. 60/292,125, entitled "VORTEX HEAT SINK FOR LOW PRESSURE DROP HIGH PERFORMANCE THERMAL MANAGEMENT ELECTRONIC ASSEMBLY SOLUTIONS," by Joseph T. DiBene II and Farhad Raiszadeh, filed May 18, 2001;

Application Serial No. 60/299,573, entitled "MICRO I-PAK STACK UP ARCHITECTURE," by Joseph T. DiBene II, Carl E. Hoge, and David H. Hartke, filed Jun. 19, 2001;

Application Serial No. 60/301,753, entitled "INTEGRATED POWER DELIVERY USING HIGH PERFORMANCE LINEAR REGULATORS ON PACKAGE WITH A MICROPROCESSOR," by Joseph T. DiBene II, Carl E. Hoge, and David H. Hartke , filed Jun. 27, 2001;

Application Serial No. 60/304,929, entitled "BORREGO ARCHITECTURE," by David H. Hartke and Joseph T. DiBene II, filed Jul. 11, 2001;

Application Serial No. 60/304,930, entitled "MICRO IPAK," by Joseph T. DiBene II, Carl E. Hoge, David H. Hartke, and Edward J. Derian, filed Jul. 11, 2001;

Application Ser. No. 09/921,152, entitled "HIGH SPEED AND DENSITY CIRCULAR CONNECTOR FOR BOARD-TO-BOARD INTERCONNECTION SYSTEMS," by David H. Hartke and Joseph T. DiBene II, filed on Aug. 2, 2001, which is a continuation in part of the following patent applications:

Application Ser. No. 09/921,153 entitled "VAPOR CHAMBER WITH INTEGRATED PIN ARRAY", by Joseph T. DiBene, II and Farhad Raiszadeh, filed on Aug. 2, 2001;

Application Ser. No. 09/910,524, entitled "HIGH PERFORMANCE THERMAL/MECHANICAL INTERFACE FOR FIXED-GAP REFERENCES FOR HIGH HEAT FLUX AND POWER SEMICONDUCTOR APPLICATIONS", by Joseph T. DiBene, II, David H. Hartke, Wendell C. Johnson, Farhad Raiszadeh, Edward J. Darien, and Jose B. San Andres, filed Jul. 20, 2001;

Application Ser. No. 09/801,437, entitled "METHOD AND APPARATUS FOR DELIVERING POWER TO HIGH PERFORMANCE ELECTRONIC ASSEMBLES" by Joseph T. DiBene II, David H. Hartke, Carl E. Hoge, James M. Broder, Edward J. Derian, Joseph S. Riel, and Jose B. San Andres, filed Mar. 8, 2001;

Application Ser. No. 09/802,329, entitled "METHOD AND APPARATUS FOR THERMAL AND MECHANICAL MANAGEMENT OF A POWER REGULATOR MODULE AND MICROPROCESSOR IN CONTACT WITH A THERMALLY CONDUCTING PLATE" by Joseph T. DiBene II and David H. Hartke, filed Mar. 8, 2001;

Application Ser. No. 09/798,541, entitled "THERMAL/MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001, which is a continuation-in-part of application Ser. No. 09/727,016, entitled "EMI CONTAINMENT USING INTER-CIRCUIT ENCAPSULATED PACKAGING TECHNOLOGY," by Joseph T. DiBene II and David H. Hartke, filed Nov. 28, 2000, and a continuation-in-part of application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II and David H. Hartke, filed Feb. 16, 2001, and a continuation in part of application Ser. No. 09/432,878, entitled "INTER-CIRCUIT ENCAPSULATED PACKAGING FOR POWER DELIVERY", by Joseph T. DiBene II and David H. Hartke, filed Nov. 2, 1999, now issued as U.S. Pat. No. 6,356,448, which is a continuation in part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450;

Application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II, David H. Hartke, James J. Hjerpe Kaskade, and Carl E. Hoge, filed Feb. 16, 2001;

Application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000;

Application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999, now issued as U.S. Pat. No. 6,356,448, which is a continuation-in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450;

and which claims priority to the following U.S. Provisional Patent Applications:

Application Serial No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Serial No. 60/196,059, entitled "EMI FRAME WITH POWER FEED-THROUGH AND THERMAL INTERFACE MATERIAL IN AN AGGREGATE DIAMOND MIXTURE," by Joseph T. DiBene I and David H. Hartke, filed Apr. 10, 2000;

Application Serial No. 60/219,813, entitled "HIGH-CURRENT MICROPROCESSOR POWER DELIVERY SYSTEMS," by Joseph T. DiBene II, filed Jul. 21, 2000;

Application Serial No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Serial No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000; and Application Serial No. 60/232,971, entitled "INTEGRATED POWER DISTRIBUTION AND SEMICONDUCTOR PACKAGE," by Joseph T. DiBene II, and James J. Hjerpe, filed Sep. 14, 2000;

Application Serial No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Serial No. 60/251,223, entitled "MICRO I-PAK FOR POWER DELIVERY TO MICROELECTRONICS," by Joseph T. DiBene II and Carl E. Hoge, filed Dec. 4, 2000;

Application Serial No. 60/251,184, entitled "MICROPROCESSOR INTEGRATED PACKAGING," by Joseph T. DiBene II, filed Dec. 4, 2000; and Application Serial No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, and Joseph T. DiBene II, filed Feb. 6, 2001; and Application Serial No. 60/277,369, entitled "THERMAL-MECHANICAL MEASUREMENT AND ANALYSIS OF AN ADVANCED THERMAL INTERFACE MATERIAL CONSTRUCTION," by Farhad Raiszadeh and Edward J. Derian, filed Mar. 19, 2001;

Application Serial No. 60/287,860, entitled "POWER TRANSMISSION DEVICE," by Joseph T. DiBene II, David H. Hartke, Carl E. Hoge, and Edward J. Derian, filed May 1, 2001;

Application Serial No. 60/291,749, entitled "MICRO I-PAK ARCHITECTURE HAVING A FLEXIBLE CONNECTOR BETWEEN A VOLTAGE REGULATION MODULE AND SUBSTRATE," by Joseph T. DiBene II, filed May 16, 2001;

Application Serial No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

Application Serial No. 60/292,125, entitled "VORTEX HEAT SINK FOR LOW PRESSURE DROP HIGH PERFORMANCE THERMAL MANAGEMENT ELECTRONIC ASSEMBLY SOLUTIONS," by Joseph T. DiBene II and Farhad Raiszadeh, filed May 18, 2001;

Application Serial No. 60/299,573, entitled "MICRO I-PAK STACK UP ARCHITECTURE," by Joseph T. DiBene II, Carl E. Hoge, and David H. Hartke, filed Jun. 19, 2001;

Application Serial No. 60/301,753, entitled "INTEGRATED POWER DELIVERY USING HIGH PERFORMANCE LINEAR REGULATORS ON PACKAGE WITH A MICROPROCESSOR," by Joseph T. DiBene II, Carl E. Hoge, and David H. Hartke, filed Jun. 27, 2001;

Application Serial No. 60/304,929, entitled "BORREGO ARCHITECTURE," by David H. Hartke and Joseph T. DiBene II, filed Jul. 11, 2001;

Application Serial No. 60/304,930, entitled "MICRO I-PAK," by Joseph T. DiBene II, Carl E. Hoge, David H. Hartke, and Edward J. Derian, filed Jul. 11, 2001; and Application Serial No. 10/022,454, entitled "ULTRA LOW IMPEDANCE POWER INTERCONNECTION SYSTEM FOR ELECTRONIC PACKAGING," by Joseph T. DiBene II, David H. Hartke, Carl E. Hoge, and Edward J. Derian, filed Oct. 30, 2001, which is a continuation in part of the following U.S. Patent Applications:

Application Ser. No. 09/818,173, entitled "INTERCIRCUIT ENCAPSULATED PACKAGING," by Joseph T. DiBene, II and David H. Hartke, filed Mar. 26, 2001;

Application Ser. No. 09/921,152, entitled "HIGH SPEED AND DENSITY CIRCULAR CONNECTOR FOR BOARD-TO-BOARD INTERCONNECTION SYSTEMS," by David H. Hartke and Joseph T. DiBene II, filed on Aug. 2, 2001;

Application Ser. No. 09/921,153 entitled "VAPOR CHAMBER WITH INTEGRATED PIN ARRAY", by Joseph T. DiBene, II and Farhad Raiszadeh, filed on Aug. 2, 2001;

Application Ser. No. 09/910,524, entitled "HIGH PERFORMANCE THERMAL/MECHANICAL INTERFACE FOR FIXED-GAP REFERENCES FOR HIGH HEAT FLUX AND POWER SEMICONDUCTOR APPLICATIONS", by Joseph T. DiBene, II, David H. Hartke, Wendell C. Johnson, Farhad Raiszadeh, Edward J. Darien, and Jose B. San Andres, filed Jul. 20, 2001;

Application Ser. No. 09/885,780, entitled "INTERCIRCUIT ENCAPSULATED PACKAGING," by Joseph T. DiBene II and David H. Hartke, filed Jun. 19, 2001, which is a continuation of application Ser. No. 09/353,428, entitled "INTERCIRCUIT ENCAPSULATED PACKAGING," by Joseph T. DiBene II and David H. Hartke, filed Jul. 15, 1999 and now issued as U.S. Pat. No. 6,304,450;

Application Ser. No. 09/801,437, entitled "METHOD AND APPARATUS FOR DELIVERING POWER TO HIGH PERFORMANCE ELECTRONIC ASSEMBLIES" by Joseph T. DiBene II, David H. Hartke, Carl E. Hoge, James M. Broder, Edward J. Derian, Joseph S. Riel, and Jose B. San Andres, filed Mar. 8, 2001;

Application Ser. No. 09/802,329, entitled "METHOD AND APPARATUS FOR THERMAL AND MECHANICAL MANAGEMENT OF A POWER REGULATOR MODULE AND MICROPROCESSOR IN CONTACT WITH A THERMALLY CONDUCTING PLATE" by Joseph T. DiBene II and David H. Hartke, filed Mar. 8, 2001;

Application Ser. No. 09/798,541, entitled "THERMAL/MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J.

Derian, filed Mar. 2, 2001, which is a continuation-in-part of application Ser. No. 09/727,016, entitled "EMI CONTAINMENT USING INTER-CIRCUIT ENCAPSULATED PACKAGING TECHNOLOGY," by Joseph T. DiBene II and David H. Hartke, filed Nov. 28, 2000, and a continuation-in-part of application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II and David H. Hartke, filed Feb. 16, 2001, and a continuation in part of application Ser. No. 09/432,878, entitled "INTER-CIRCUIT ENCAPSULATED PACKAGING FOR POWER DELIVERY", by Joseph T. DiBene II and David H. Hartke, filed Nov. 2, 1999, now issued as U.S. Pat. No. 6,356,448, which is a continuation in part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450;

Application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II, David H. Hartke, James J. Hjerpe Kaskade, and Carl E. Hoge, filed Feb. 16, 2001;

Application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000;

Application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999, now issued as U.S. Pat. No. 6,356,448, which is a continuation-in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450;

and which claims priority to the following U.S. Provisional Patent Applications:

Application Serial No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Serial No. 60/196,059, entitled "EMI FRAME WITH POWER FEED-THROUGH AND THERMAL INTERFACE MATERIAL IN AN AGGREGATE DIAMOND MIXTURE," by Joseph T. DiBene II and David H. Hartke, filed Apr. 10, 2000;

Application Serial No. 60/219,813, entitled "HIGH-CURRENT MICROPROCESSOR POWER DELIVERY SYSTEMS," by Joseph T. DiBene II, filed Jul. 21, 2000;

Application Serial No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Serial No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000; and Application Serial No. 60/232,971, entitled "INTEGRATED POWER DISTRIBUTION AND SEMICONDUCTOR PACKAGE," by Joseph T. DiBene II, and James J. Hjerpe, filed Sep. 14, 2000;

Application Serial No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Serial No. 60/251,223, entitled "MICRO I-PAK FOR POWER DELIVERY TO MICROELECTRONICS," by Joseph T. DiBene II and Carl E. Hoge, filed Dec. 4, 2000;

Application Serial No. 60/251,184, entitled "MICROPROCESSOR INTEGRATED PACKAGING," by Joseph T. DiBene II, filed Dec. 4, 2000; and Application Serial No. 60/266,941, entitled "MECHANICAL INTERCONNECTION TECHNOLOGIES USING FLEX CABLE INTERCONNECT FOR DELIVERY IN 'INCEP' INTEGRATED ARCHITECTURE," by David H. Hartke, James M. Broder, and Joseph T. DiBene II, filed Feb. 6, 2001; and Application Serial No. 60/277,369, entitled "THERMAL-MECHANICAL MEASUREMENT AND ANALYSIS OF ADVANCED THERMAL INTERFACE MATERIAL CONSTRUCTION," by Farhad Raiszadeh and Edward J. Derian, filed Mar. 19, 2001;

Application Serial No. 60/287,860, entitled "POWER TRANSMISSION DEVICE," by Joseph T. DiBene II, David H. Hartke, Carl E. Hoge, and Edward J. Derian, filed May 1, 2001;

Application Serial No. 60/291,749, entitled "MICRO I-PAK ARCHITECTURE HAVING A FLEXIBLE CONNECTOR BETWEEN A VOLTAGE REGULATION MODULE AND SUBSTRATE," by Joseph T. DiBene II, filed May 16, 2001;

Application Serial No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

Application Serial No. 60/292,125, entitled "VORTEX HEATSINK FOR LOW PRESSURE DROP HIGH PERFORMANCE THERMAL MANAGEMENT ELECTRONIC ASSEMBLY SOLUTIONS," by Joseph T. DiBene II and Farhad Raiszadeh, filed May 18, 2001;

Application Serial No. 60/299,573, entitled "MICRO I-PAK STACK UP ARCHITECTURE," by Joseph T. DiBene II, Carl E. Hoge, and David H. Hartke, filed Jun. 19, 2001;

Application Serial No. 60/301,753, entitled "INTEGRATED POWER DELIVERY USING HIGH PERFORMANCE LINEAR REGULATORS ON PACKAGE WITH A MICROPROCESSOR," by Joseph T. DiBene II, Carl E. Hoge, and David H. Hartke, filed Jun. 27, 2001;

Application Serial No. 60/304,929, entitled "BORREGO ARCHITECTURE," by David H. Hartke and Joseph T. DiBene II, filed Jul. 11, 2001;

Application Serial No. 60/304,930, entitled "MICRO IPAK," by Joseph T. DiBene II, Carl E. Hoge, David H. Hartke, and Edward J. Derian, filed Jul. 11, 2001; and Application Serial No. 60/310,038, entitled "TOOLLESS CONCEPTS FOR BORREGO," by Edward J. Derian and Joseph T. DiBene II, filed Aug. 3, 2001;

Application Serial No. 60/313,338, entitled "TOOLLESS PRISM IPA ASSEMBLY TO SUPPORT IA64 MCKINLEY MICROPROCESSOR," by David H. Hartke and Edward J. Derian, filed Aug. 17, 2001;

Application Serial No. 60/338,004, entitled "MICRO-SPRING CONFIGURATIONS FOR POWER DELIVERY FROM VOLTAGE REGULATOR MODULES TO INTEGRATED CIRCUITS AND MICROPROCESSORS," by Joseph T. DiBene II, David H. Hartke, Carl E. Hoge, and Edward J. Derian, filed Nov. 8, 2001.

BACKGROUND OF THE INVENTION

1. Field of the Invention

This invention relates to a power conversion methodology and circuit for a tapped-inductor buck topology that in general relates to systems and methods for power conversion, and in particular to a system and method for power conversion that takes advantage of an integrated magnetic auxiliary reset winding and intrinsic leakage inductance in the coupled inductors of a tapped-inductor buck converter to reuse the energy in the circuit to help power a simple MOSFET lower switch gate-drive circuit which improves the overall efficiency of the converter, while simultaneously simplifying the circuit design in multiphase power conversion for voltage regulation (VR) technologies.

2. Description of the Related Art

High performance electronics today are demanding higher performance power delivery than in previous years. As an example, high performance microprocessors are forcing power converters to supply voltages at 1 Volt (V) and below and deliver power over 100 Watts (W). This translates to delivered currents in excess of 100 amps. Moreover, the small space allocated on motherboards and other printed circuit boards, along with the thermal considerations at the system level, require the voltage regulators to be highly efficient, have low noise, and maintain a very small form factor. This trend is requiring advancements in power conversion technology which not only necessitate using advanced componentry but sophisticated topologies and circuit design in power conversion as well.

Today, input voltages for many non-isolated power converter technologies in high performance microelectronics is 12V (though 48V input voltages are becoming more common as well). Use of lower input voltages than 12V increases conduction loss and is used less frequently. Use of higher input voltages often results in more complex power distribution and is typically more costly. As an example, 48V input converters usually require the addition of a 48V to 12V first stage converter followed by a second stage 12V to low voltage (e.g. 1V to 2V) converter to optimize the efficiency and performance of the field effect transistors (FETs) typically used in such circuits. To maximize efficiency, space, and cost, most non-isolated DC-to-DC converters today are based upon the simple Buck topology.

FIG. 1 shows a schematic of a buck converter circuit 100. The buck converter circuit 100 has a first main switch 104 coupled to an input signal 102 and a second main switch 106. Typically, the first and second main switches 104 and 106 are field effect transistors (FETs) such as metal oxide field effect transistors (MOSFETs), each having gates 114 and 116, respectively. As illustrated in FIG. 1, the switches 104 and 106 can be individual switches or can be combined in a single device. In combination with the other circuit elements illustrated, the switches are used to step down the higher 12V input to a lower voltage—typically below 2V.

An inductor 108 is connected between the output $V_{out}$ 112 and the junction of the two switches 104 and 106 (labeled "A" in FIG. 1). The drain of the first (upper) switch 104 is electrically connected to $V_{in}$ 102, which is typically 12 volts, while the source of the lower switch 106 is electrically connected to ground 122 with one end of the inductor 108 between them. The output 112 includes a capacitor 110 connected between inductor 108 and ground 122 for storage of charge and filtering. A load (not shown) is connected to the output 112 where power is delivered.

FIG. 2 is a timing diagram further illustrating the operation of buck converter 100. When the upper switch 104 is on ($V_{G104}$ at time $t_1$ to $t_2$), the gate voltage 116 on lower switch 106 ($V_{G106}$ at time $t_1$ to $t_2$) is at a low voltage, turning off lower switch 106. Because the upper FET 104 is on, the voltage at node A is high ($V_A$ at time $t_1$). A controller (not shown) drives the two switches 104 and 106. The control of switches 104 and 106 is timed so that each switch is (ideally) off when the other switch is on. However, FET switches 104, 106 cannot turn on and off instantaneously in a perfectly timed manner. Additionally, parasitic effects of the FET switches 104, 106, such as the substrate diode and the drain-to-source capacitance, contribute to the non-ideal switching. What occurs is the substrate diode of the lower switch is brought into conduction due to the upper transistor switch not instantaneously responding to the inductor current with the lower switch turned off. Because of these problems, large voltage and current spikes occur across the FET switches 104 and 106, particularly the upper FET switch 104, which results in increased losses through the FETs 104 and 106 [$P_{104/106}$ from $t_1$ to $t_2$] and can cause potential damage to the FETs themselves. Also occurring at time $t_1$, the current through upper FET 104 spikes [$I_{S104}$ at time $t_1$] due to the substrate diode of lower FET 106 continuing to conduct even after the gate voltage 116 of FET 106 is low (e.g. the FET is turned off). This surge current continues until the substrate diode of FET 106 is completely off. The current through upper FET 104 then increases until time $t_2$ when the gate voltage [$V_{G104}$ at time $t_2$] goes low and another power spike occurs at time $t_2$. During the on cycle of the upper FET 104 power is being delivered to the output. This can be seen by noticing the inductor current $I_{108}$ increases until time $t_2$ when upper FET switch 104 is turned off. During the conduction cycle of the lower FET 106, current continues to flow through inductor 108 from time $t_2$ to time $t_3$. The cycle repeats itself starting at time $t_3$.

The asymmetric behavior of the current through inductor 108 in a buck converter results in a large ripple voltage, which may not be conducive to proper electronic device operation. Thus, to mitigate this problem, designers typically use multiple phases of the buck topology to reduce output voltage ripple and current through each FET. A multi-phase buck converter has two or more converters, similar to buck converter 100, operating synchronously through a main controller circuit to deliver power to a common load. Multi-phase operation helps reduce output voltage ripple while sharing the current equally through each phase of the converter.

Though the buck converter 100 is simple and elegant it has its drawbacks for high current low voltage power delivery. The duty cycle for the buck converter is small and may be approximated by the relation D≈Vo/Vin, resulting in very short on times for the upper FET switch 104 as illustrated above. Because of this short duty cycle the rising and falling inductor currents are asymmetric resulting in poor transient response. This is because the declining rate of change of current of the inductor 108 is slow relative to the rising speed. Additionally, the turn-off current for the upper FET switch 104 is equivalent to the peak output current, which results in very high losses in the upper FET during the switching, cycles (e.g. when the upper FET switch is on). Some of these problems may be mitigated through modifications of the standard buck topology as will be shown.

FIG. 3 is a diagram showing another converter topology known as a tapped-inductor buck converter 300. The tapped-inductor buck converter 300 uses a coupled input inductor 304 and output inductor 310 between the upper FET 306 and the input voltage source 302 with the inductors coupling magnetically to each other. Throughout this description coupled inductors will be shown with the dot convention . . . one type of dot will show coupling between one set of coupling, etc. Instead of the drain of the upper FET 306 connecting to the input voltage 302 the input inductor 304 is connected between it and the input 302. As shown in FIG. 3, tapped-inductor buck converter circuit 300 has input voltage source VIN 302 connected to inductor 304 which is connected to upper FET 306 and magnetically coupled to output inductor 310 such that when the upper FET 306 is off, the magnetic flux through the input inductor 304 induces a current in output inductor 310 which flows into the output VOUT 312. VOUT 312 is coupled to ground via capacitor 318. Also note, the arrangement shown in circuit 300, although not literally a 'tapped-inductor', is a derivative of a tapped-inductor configuration wherein the switch 306 has been moved from the input side VIN 302 to the side connecting to the output inductor 310. This configuration is more conducive to driving upper FET 306 with lower voltage levels than in an actual tapped-inductor configuration. FETs 306 and 308 are controlled by a control signal applied to gates 316 and 314.

FIG. 4 is a timing diagram illustrating the operation of the tapped-inductor buck converter 300. At time $t_1$ to $t_2$, when upper FET 306 is on $V_{G306}$ is positive, lower FET 308 is off. The voltage at node A goes high, i.e., $V_A(t_1$ to $t_2)=V_{out}+(V_{in}-V_{out})/n$, where n is the turns ratio ($n=[N_{304}+N_{310}]/N_{310}$, N represents the number of turns on each winding.) Current through upper FET 306 at time $t_1$ is initially high due to the conduction in the substrate diode of lower FET 308 until it fully shuts off. The current continues to rise until time $t_2$ when the upper FET 306 is turned off. The duty cycle, $D=[nVout]/[Vin+(n-1)Vout]$, is typically larger for the tapped-inductor buck converter 300 than the standard buck converter 100 and can be modified by changing the inductor turns ratios, n, as the input and output voltages are changed to optimize the switching and conduction losses in the FETs 306 and 308. This is an advantage over a standard buck converter 100. The current through output inductor 310, $I_{310}$, also shows that the rate of change of current can be made approximately the same in both the switching and conduction cycles of the converter by appropriate selection of n. This results in a better transient response over the standard buck converter.

As explained above, the tapped-inductor buck converter 300 typically has a larger duty cycle and a more balanced inductor current through the full switching cycle. Additionally, the losses through the upper FET 306 and lower FET 308 are less due to the reduced peak currents through the upper FET 306 and the shorter conduction time through the lower FET 308. However, the tapped-inductor buck converter 300 has some drawbacks as well. First, when the upper FET switch 306 is turned off, the voltage across the input inductor 304 reverses, resulting in a large voltage spike across the upper FET 306. This voltage is typically higher even than in a standard buck converter due to the addition of the input coupled inductor 310. Additionally, the imperfect coupling between the input 304 and output inductors 310 results in a leakage inductance which increases this voltage spike even further. This voltage spike can destroy the upper FET 306 if not kept in check and results in increased losses through the upper FET 306 as well. Use of integrated planar magnetics (e.g. magnetic windings imbedded within the planes of the printed circuit board) helps to reduce the leakage inductance but the leakage inductance is still typically quite high due to lack of the ability to perfectly couple inductors 304 and 310. The other problem is timing and control of the upper FET switch 306. FET controllers and gate drivers are often used to control the upper and lower FET switches of multi-phase buck converters. Such devices are used to synchronize the turn-on and turn-off times of the FETs 306 and 308 to minimize losses. However, the devices are often expensive, can have fairly slow slew-rates, do not adjust the timing perfectly between the upper and lower FETs well enough, and often put out low gate drive voltages which can impact conduction losses in the FET—particularly the lower FET 308. If a FET controller is imperfect and poor synchronization occurs between the turning off of the upper and lower FETs 306 and 308, losses will be increased in both devices resulting in a less efficient converter.

There have been a number of circuits and methods proposed to solve some of these problems intrinsic to the tapped-inductor buck and standard buck converters. However, these methods have typically only addressed portions of the overall problem which have limited the use of tapped-inductor buck converters to date. What is needed is a method and circuit technique which uses the advantages of the multi-phase tapped inductor buck converter and makes use of some of the facets of the design, such as leakage inductance, to improve efficiency, form factor, and gate-drive control in an integrated manner to result in a simpler, more elegant power conversion methodology and topology than exists today. The present invention accomplishes this goal.

SUMMARY OF THE INVENTION

The present invention is described as a method and apparatus for regulating voltage. The apparatus comprises an input inductor having an input inductor first terminal coupled to an input signal and an input inductor second terminal; a first switch, having a first switch first terminal coupled to the input inductor second terminal, a first switch second terminal, and a first switch control terminal coupled to a control signal; a second switch, having a second switch first terminal coupled to the first switch second terminal, a second switch second terminal coupled to ground, and a second switch control terminal; an output inductor magnetically coupled to the input inductor according to a first coupling coefficient loosely coupled, the output inductor having an output inductor first terminal coupled to the second switch first terminal, and an output inductor second terminal coupled to an output signal; an auxiliary inductor having a first auxiliary inductor terminal coupled to ground via a first capacitor and a second auxiliary inductor terminal coupled to the second switch control terminal via a resistor, wherein the auxiliary inductor is magnetically coupled to the input inductor according to a second coupling coefficient higher than the first coupling coefficient; and a third switch, having a third switch first terminal coupled to the second switch control terminal, a control terminal coupled to the control signal. The present invention uses leakage inductance manifested by loose coupling between inductors to provide additional control over the switching FETs.

BRIEF DESCRIPTION OF THE DRAWINGS

Referring now to the drawings in which like reference numbers represent corresponding parts throughout.

DETAILED DESCRIPTION OF PREFERRED EMBODIMENTS

In the following description, reference is made to the accompanying drawings which form a part hereof, and which is shown, by way of illustration, several embodiments of the present invention. It is understood that other embodiments may be utilized and changes may be made without departing from the scope of the present invention.

DETAILED DESCRIPTION OF THE PREFERRED EMBODIMENTS

Figure 1:
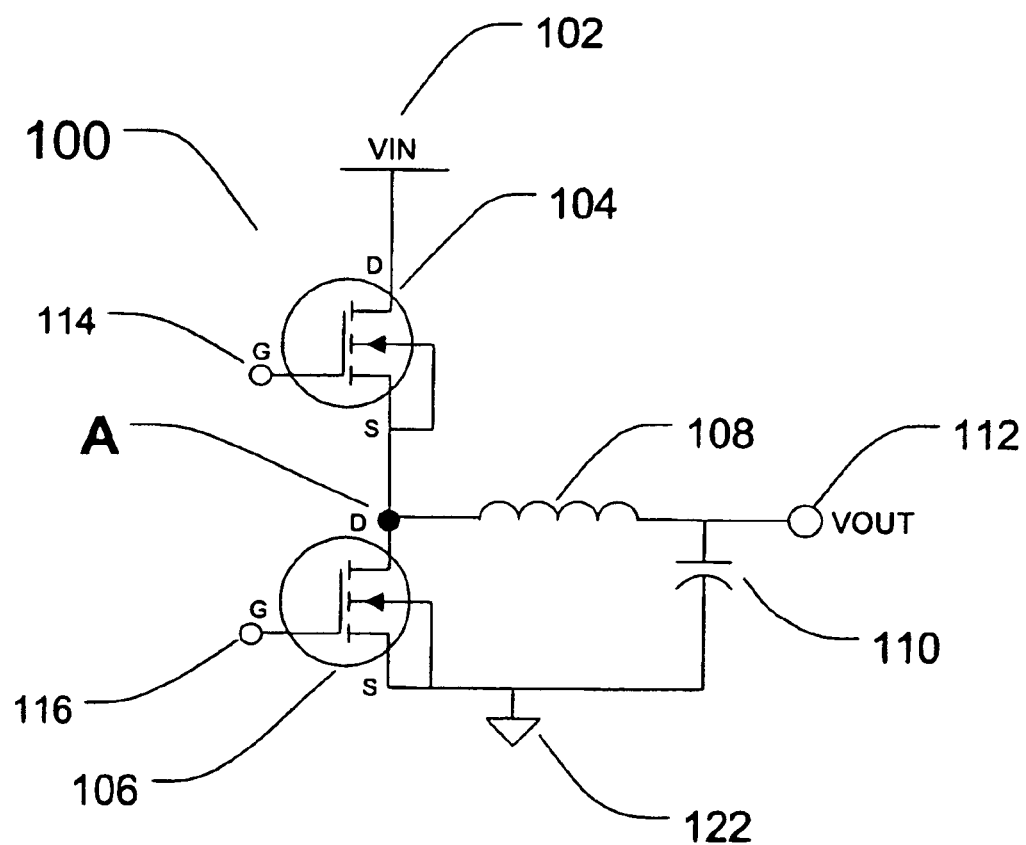
FIG. 1 is a simplified circuit schematic of a typical single-phase buck converter.
Figure 2:
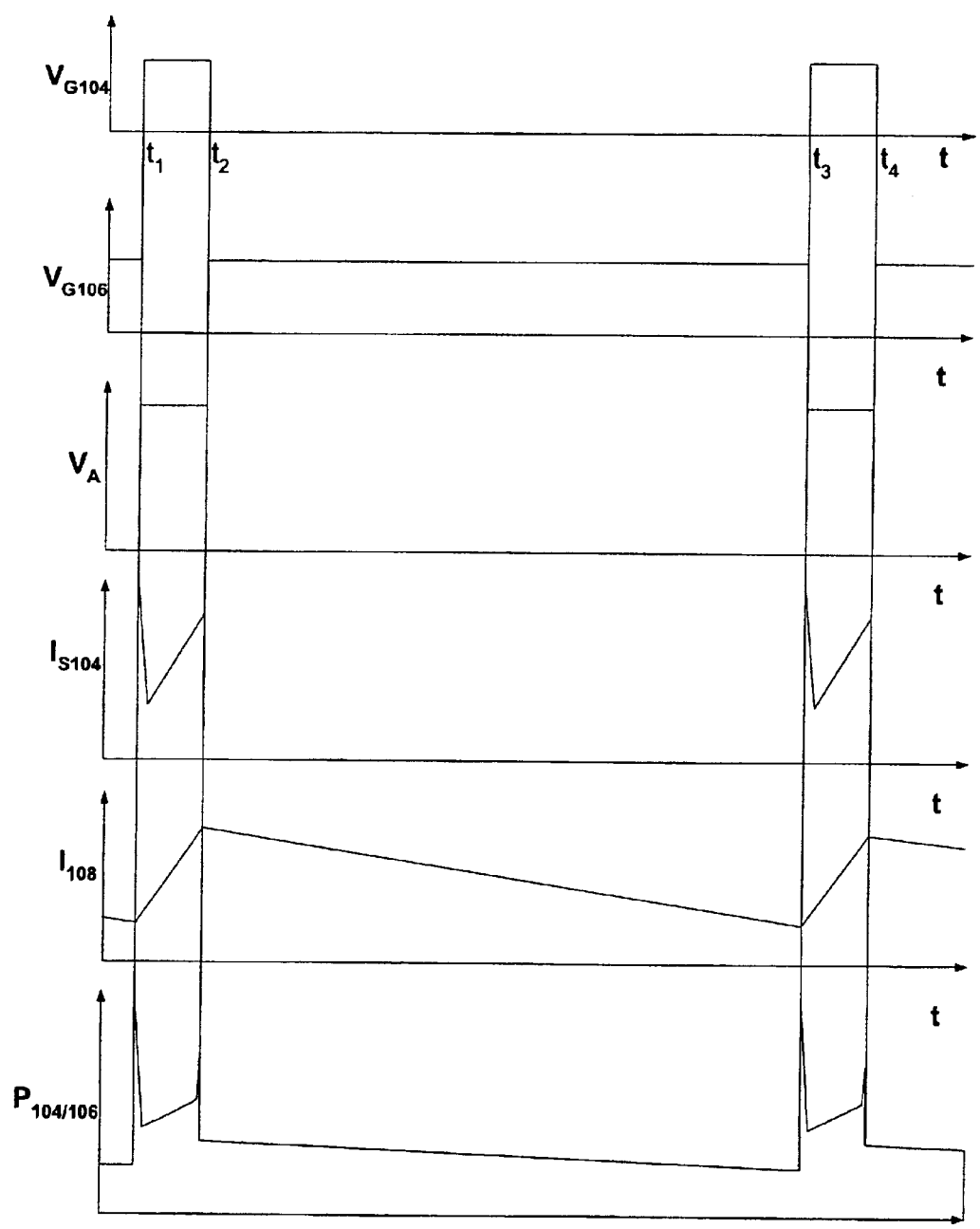
FIG. 2 is a series of timing diagrams illustrating the operation of the buck converter shown in FIG. 1.
Figure 3:
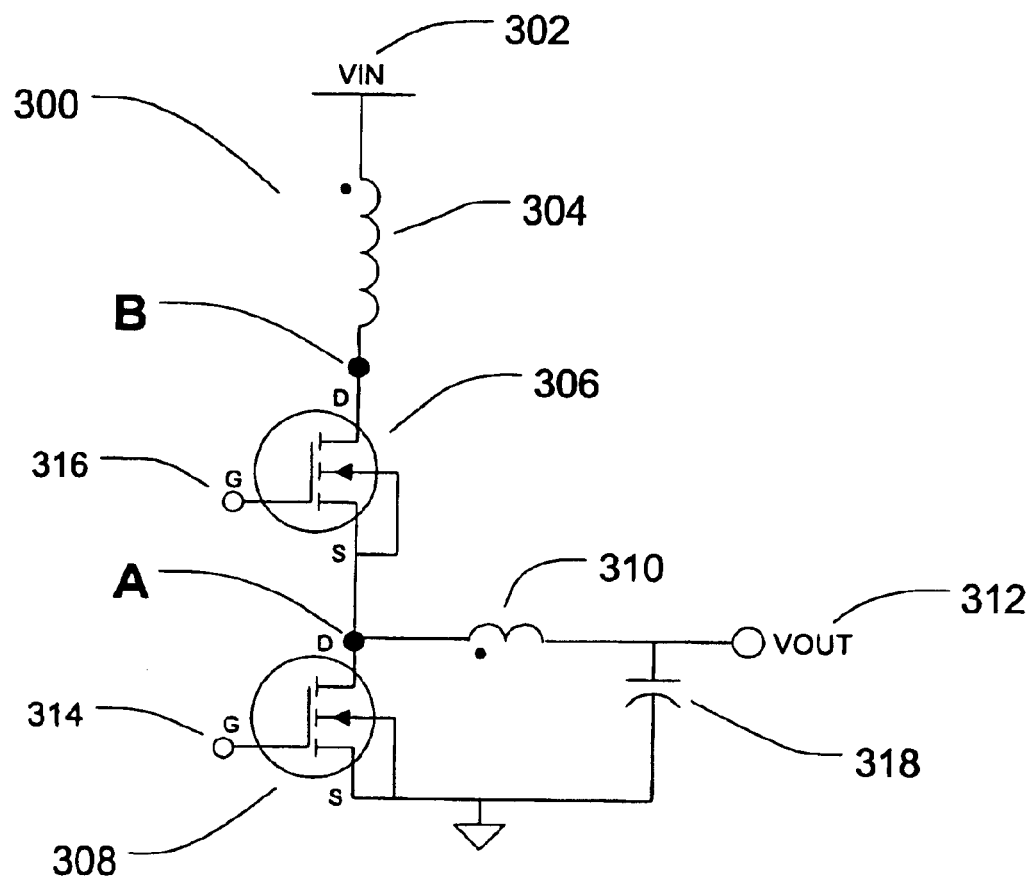
FIG. 3 is a simplified circuit schematic of a tapped-inductor buck converter.
Figure 4:
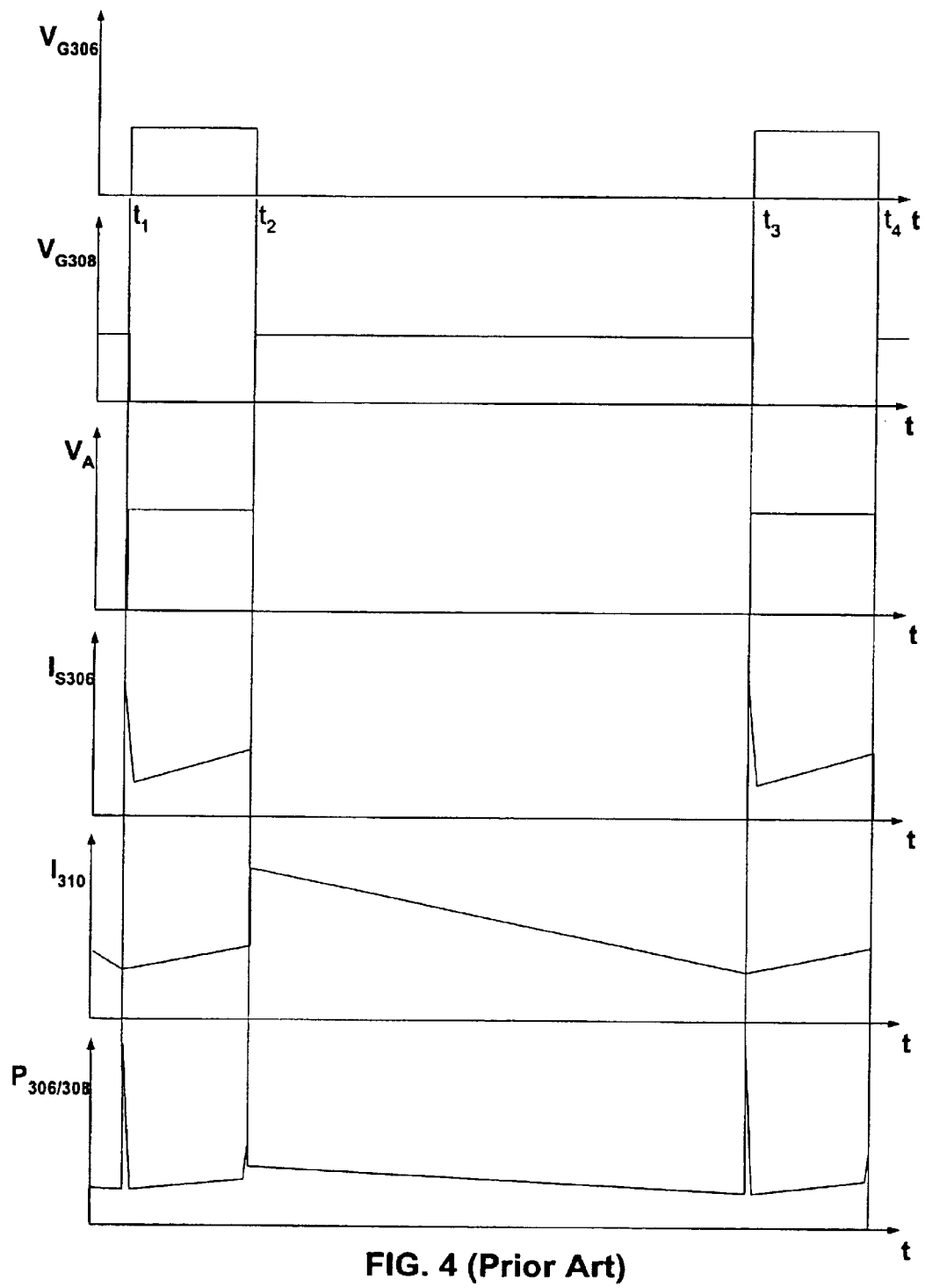
FIG. 4 is a series of timing diagrams illustrating the operation of the tapped-inductor buck converter shown in FIG. 3.
Figure 5:
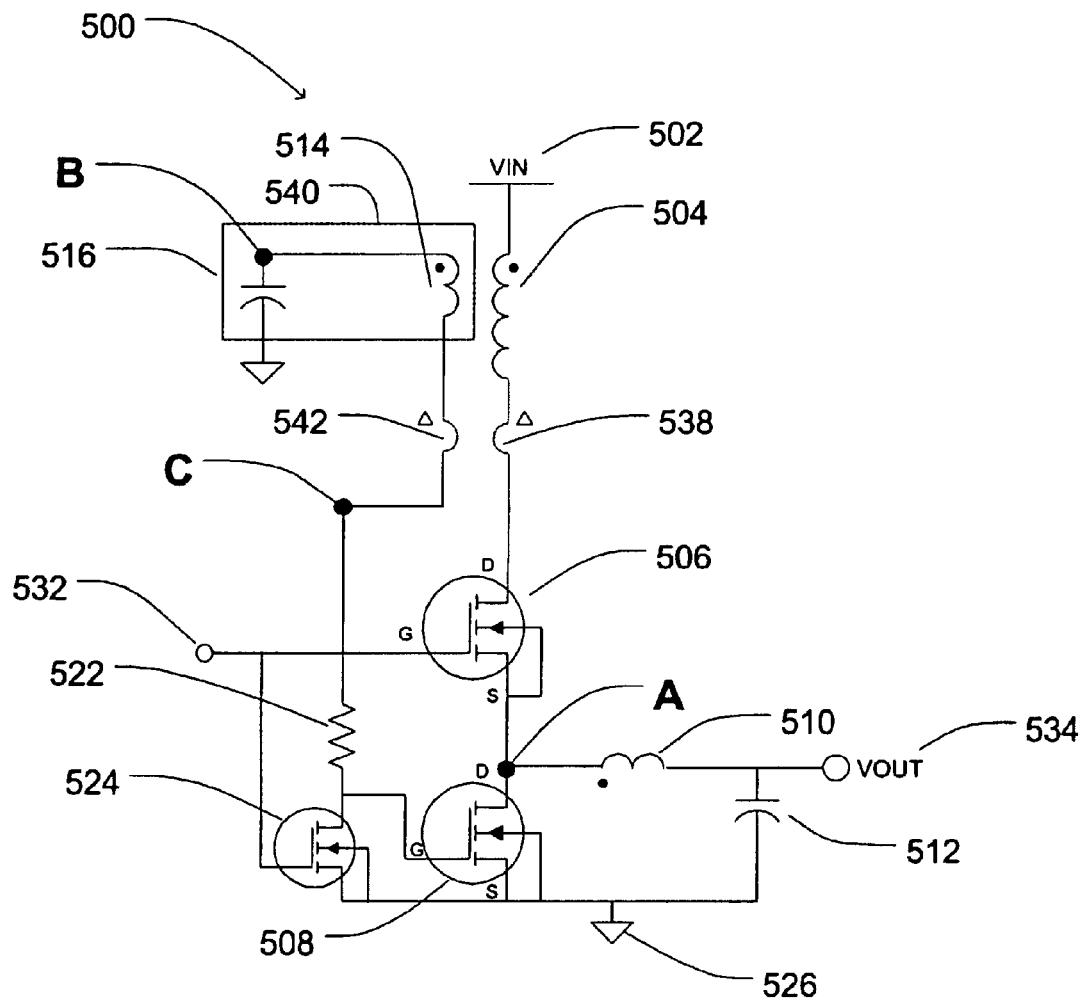
FIG. 5 is a circuit schematic showing the first embodiment of the present invention in a single-phase representation.

FIG. 5 is a circuit diagram showing a first embodiment of the present invention. Coupled input inductor 504 and output inductor 510, upper FET 506, lower FET 508 are identical to those discussed previously in description of tapped-inductor buck converter 300, except where noted.

Auxiliary winding 514 is tightly coupled (e.g. having a coupling coefficient substantially close to one) to input inductor 504. Thus, the leakage inductance induced by coupling between the auxiliary winding 514 and the input inductor 504 is small enough to be neglected. Conversely, input inductor 504 and output inductor 510 are loosely coupled to increase leakage inductance. The present invention advantageously uses the induced inductance from the loose coupling to minimize spikes and other anomalies in the output signal. Further, in many cases, the inductors are implemented with windings disposed within and/or on circuit boards in situations where space is at a premium. Because the present invention permits loose coupling between inductors, it also provides increased flexibility regarding where and how the inductor windings are located on the circuit boards. For example, in one embodiment of the present invention, the voltage regulator is implemented in a circuit board having an aperture disposed therethrough, and one or more of the voltage regulator's inductive elements can be disposed at/about the periphery of the aperture.

Storage capacitor 516 connects to auxiliary winding 514 on one side and ground 526 on the other. Input inductor 504 shows series element leakage inductor 538 which is coupled to series element leakage inductor 542 connected to auxiliary winding 514 at node C. Resistor 522 connects to gate drive FET 524 which in turn drives gate of lower FET 508. Control input 532 connects to both upper FET 506 and gate drive (lower) FET 524. Separate gate drive signals may be connected to upper FET 506 and gate drive FET 524 for optional increased timing control to either or both FETs 506, 508. Note that both series element leakage inductors 542 and 538 are intrinsic to input inductor 504 and output inductor 510 (note that the inductance is shown reflected into auxiliary winding 514, though is physically interpreted to be part of output inductor 510) but do not exist physically as separate elements. However, because the present invention advantageously utilizes this leakage inductance, it is illustrated as part of auxiliary winding 514 and input inductor 504 for clarity.

Figure 6:
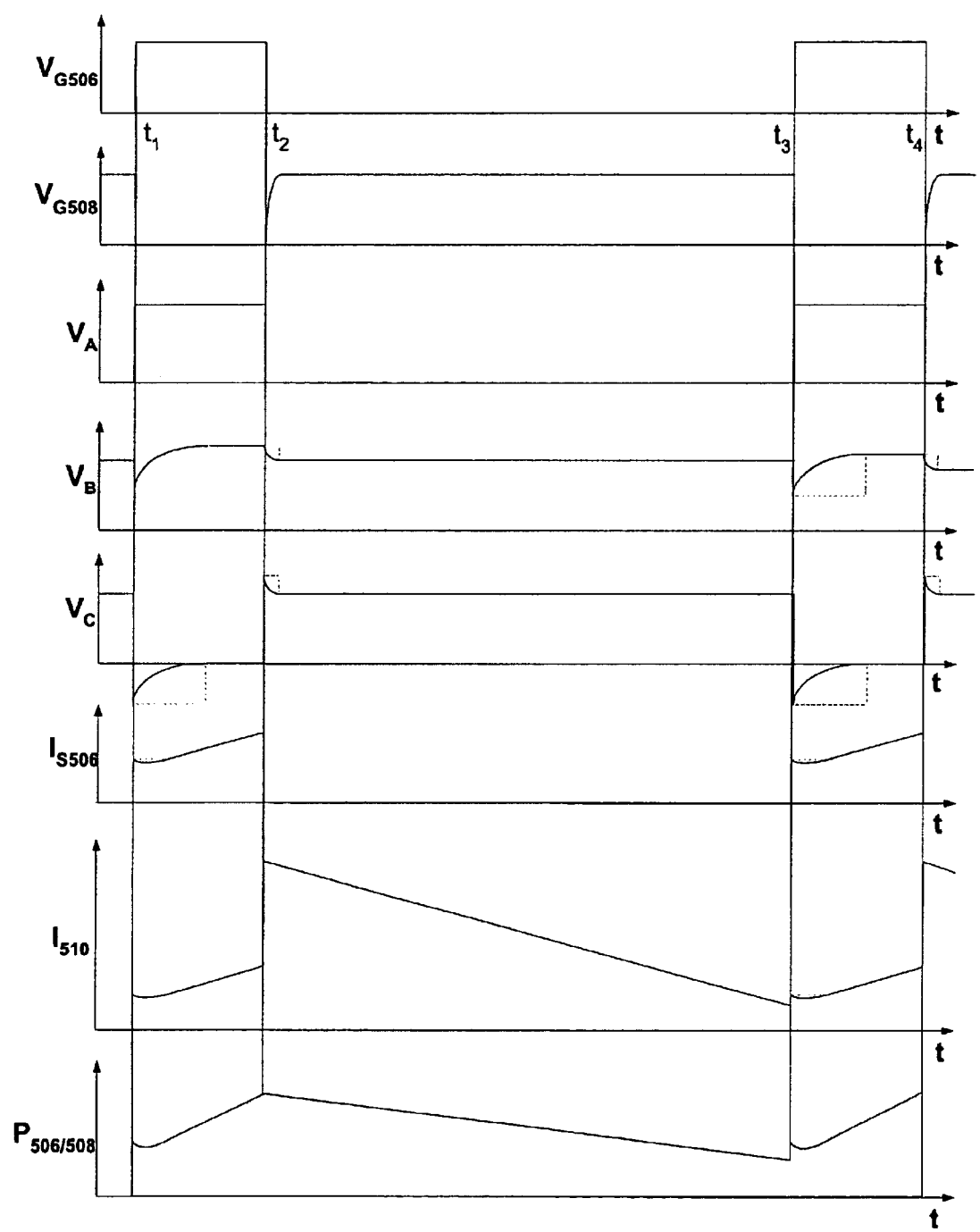
FIG. 6 is a series of timing diagrams illustrating the operation of the first embodiment of the present invention shown in FIG. 5.

Referring now to FIG. 5 and FIG. 6 by way of illustration, when gate drive signal $V_{G506}$ is high at control input 532 at time $t_1$ to $t_2$, upper FET 506 is on and current flows to coupled output inductor 510 resulting in waveform $V_A$. Simultaneously, starting at time $t_1$, voltage is transferred to auxiliary winding 514 which charges capacitor 516 through resistor 522 and gate drive FET 524 where FET 524 is in the on state (See voltage waveforms $V_B$ and $V_C$.). This in turn keeps gate of lower FET 508 low and in an off state. As in typical tapped-inductor buck converter, current rises through upper FET 506 and inductor 510 from time $t_1$ to $t_2$ as shown in FIG. 6 waveform $I_{510}$. The initial current spike in $I_{510}$ is due to the charging current being delivered to capacitor 516. When upper FET 506 is turned off at time t2 current through output inductor 510 is shown decreasing at approximately the same rate as when it increases. As stated previously, this can be accomplished through a judicious choice of the inductor turns ratio between the input inductor 504 and output inductor 510. This ensures a balanced transient response. When upper FET 506 is turned off at time $t_2$, energy stored in leakage inductors 538 and 542 is typically lossed through both FETs 506 and 508. However, because of auxiliary winding 514 and the coupling of leakage inductance, energy from leakage inductors 538 and 542, energy is re-used to boost the gate drive of FET 508. This results in lack of power spikes as shown in waveform $P_{506/508}$ in FIG. 6. By way of explanation, at time $t_2$, voltage across inductor 504 and leakage inductance 542 reverses due to shutting off of FET 506. Auxiliary winding 514 reverses its voltage and current flows from capacitor 516 to charge gate of lower FET 508 through resistor 522. Use of external gate drive and auxiliary winding circuit along with simultaneous control from the input control signal at 532 insures fast charging and discharging of gate capacitance of lower FET 508 which improves turn-on and turn-off timing between upper and lower FET switches 506 and 508, respectively. Note the slight reduction in the voltage $V_B$ at $t_2$ which is the result of charge loss from capacitor 516 into the gate capacitance of FET 508. Additionally, during conduction time, $t_2$ to $t_3$, lower FET 508 acts as a "freewheeling" diode and energy stored in output inductor 510 is transferred during this conduction cycle to output VOUT 534. VOUT is coupled to ground via capacitor 512.

When upper FET 506 is turned back on at time $t_3$, typically a large power spike occurs and power is lossed through upper and lower FETs 506 and 508 respectively due to undesired conduction of lower FET 508 substrate diode creating a short to ground for the short duration of the switching cycle—as in typical tapped-inductor buck converter. This is often the case in the beginning of the switching cycle of a buck type converter as previously discussed. However, leakage inductance 538, 542 reduces this current and temporarily stores it until upper FET 506 fully turns on and lower FET 508 fully turns off. Then, the energy stored in the leakage inductance 538, 542 is recovered and delivered to the output inductor 510 resulting in improved efficiency and reduced power spikes as can be seen in power waveform $P_{506/508}$.

Figure 7:
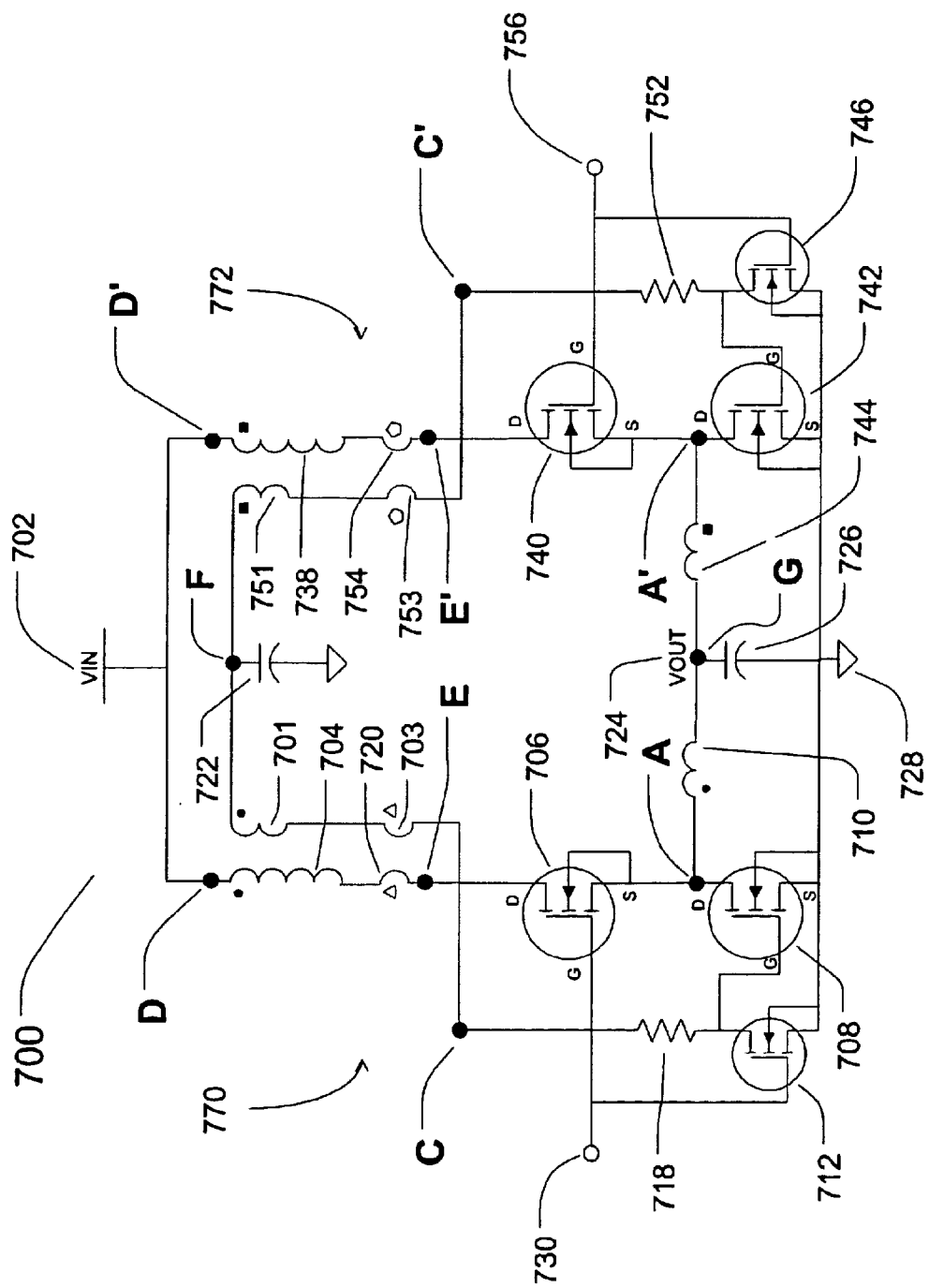
FIG. 7 is a circuit schematic showing a multi-phase embodiment of the present invention.
Figure 8:
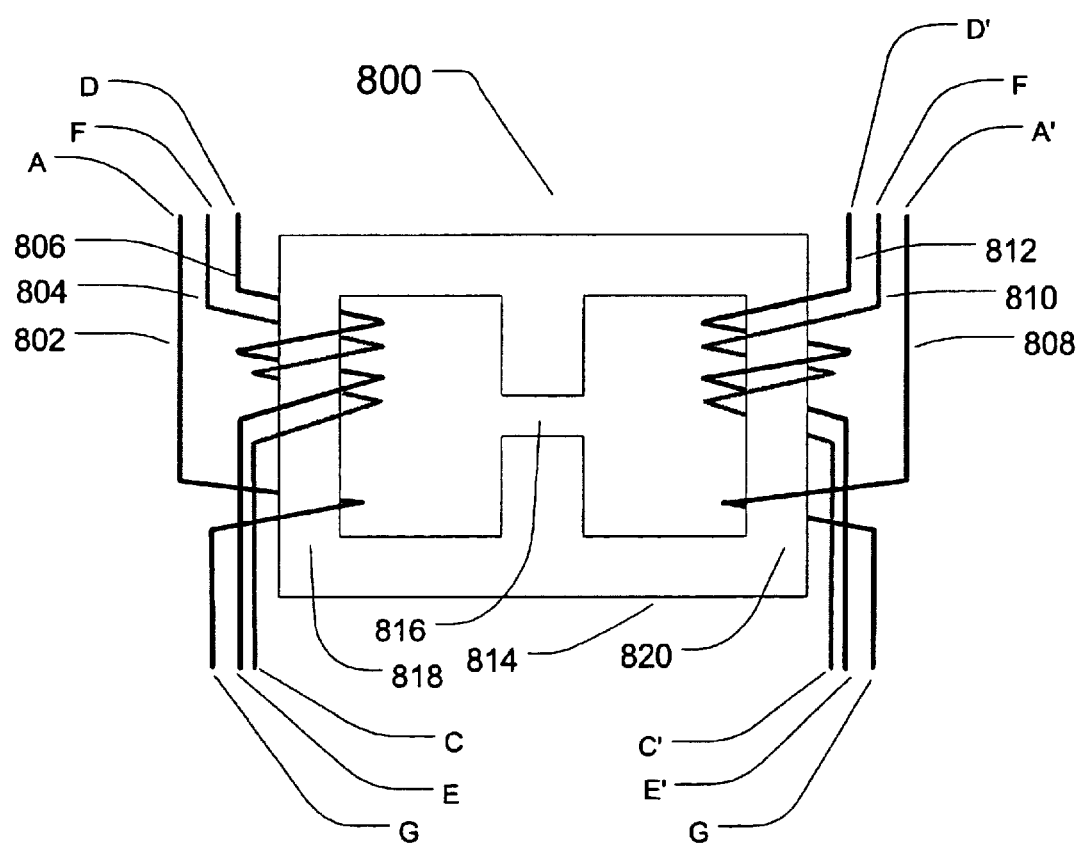
FIG. 8 is a diagram of a magnetic structure and coupling that can be used to implement the circuit illustrated in FIG. 7.
Figure 9:
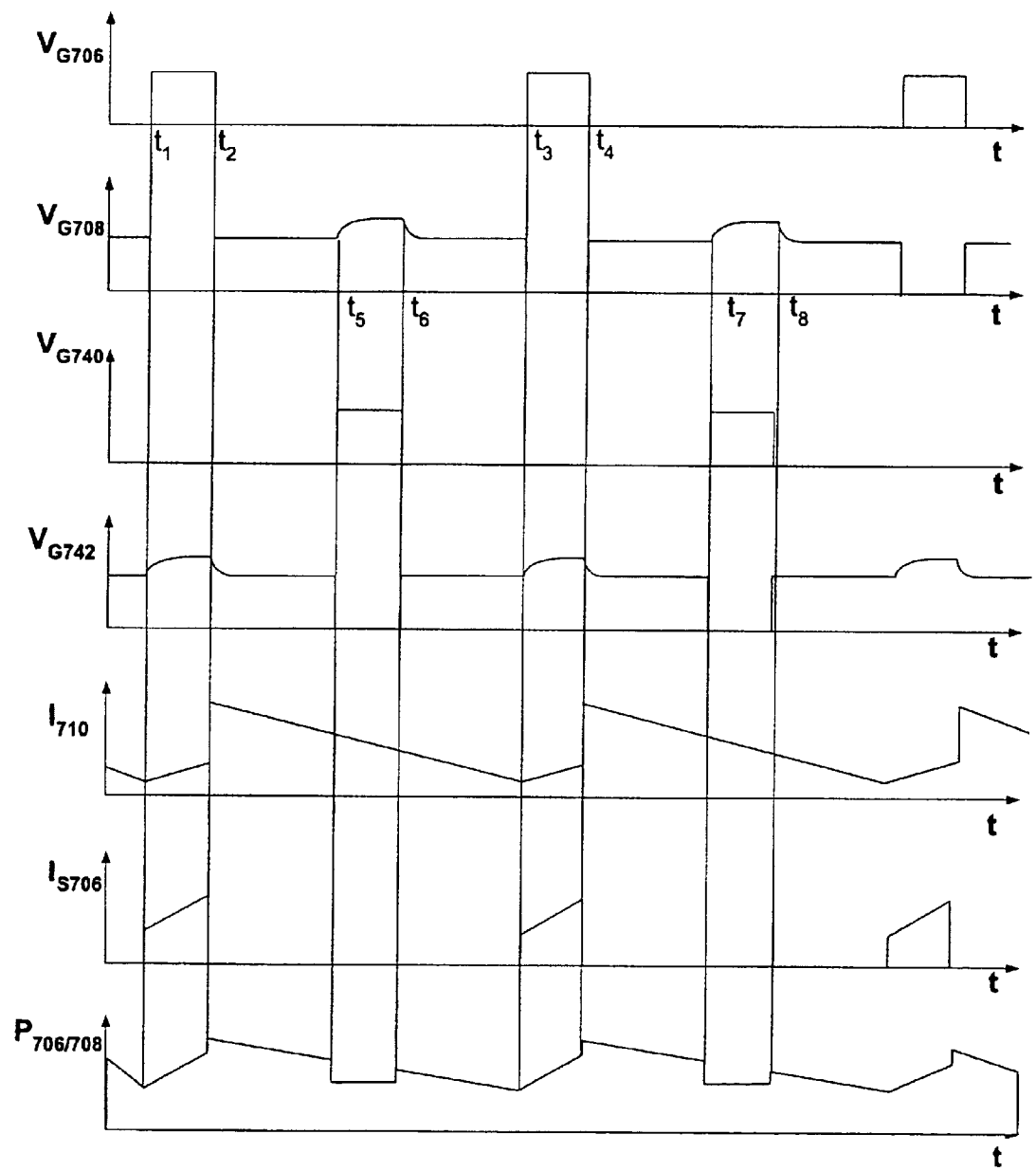
FIG. 9 is a series of timing diagrams illustrating the operation of embodiment shown in FIG. 7.

FIGS. 7–9 are diagrams of further embodiments of the invention. FIG. 7 presents a circuit diagram of a dual-phase version of the tapped-inductor buck converter illustrated in FIG. 5. The dual phase version includes a first phase synchronization circuit 770, and a second phase synchronization circuit 772. The first phase synchronization circuit 770 includes elements identical to those shown in FIG. 5, including input inductor 704, output inductor 710, first FET 706, second FET 708, auxiliary winding 701, series leakage inductances 720 and 703, resistive element 718 and FET 712.

The second phase synchronization circuit 772 includes elements analogous in function to the elements in the first phase synchronization circuit 770, including input inductor 704, output inductor 710, first FET 706, second FET 708, auxiliary winding 701, series leakage inductances 720 and 703, resistive element 718 and FET 712. Timing between the first phase synchronization circuit 770 and the second phase synchronization circuit 772 is controlled by the first control signal 730 and the second control signal 756, respectively. The first and second control signals 730 and 756 can both be provided by a single controller, or two controllers, properly synchronized. Of course, the foregoing invention can be practiced in embodiments having more than two phases as well.

FIG. 8 shows a representation of the planar magnetic core and winding structure that can be used to implement inductive elements 701, 703, 704, 710, 720, 738, 744, 751, 753, and 754. FIG. 9 shows waveforms of the dual-phase embodiment shown in FIG. 7.

Referring now to FIG. 7 and FIG. 9, gate signal 730, $V_{G706}$, to upper FET 706 of left side of the converter 770 (phase 1) is high from $t_1$ to $t_2$ allowing current to conduct from input 702 through input inductor 704 through upper FET 706 and output inductor 710 to capacitor 726 and output 724. During this time, the right side of converter 772 (phase 2) gate signal 756 to upper FET 740 is off and lower FET 742 is on while energy stored in lower inductor 744 of phase 2 is delivering current to load (coupled to $V_{OUT}$ in conduction mode for phase 2). As seen in the first and third waveforms of FIG. 9, gate signal $V_{G740}$ is 180 degrees out of phase with gate signal $V_{G706}$. Current continues to rise in first phase 770 from time $t_1$ to $t_2$ in a manner similar to the operation of the converter in FIG. 5, in inductor 710 through FET 706, and inductor 710 as shown via waveforms $I_{710}$ and $I_{S706}$ respectively, in FIG. 9. During this time, current is decreasing through inductor 744. While this current is not shown in FIG. 9, it is identical in shape to waveform $I_{710}$ but 180 degrees out of phase with $I_{710}$. Note that during time $t_1$ to $t_2$, power through FETs 706 and 708 is very low due to sharing of current in dual phase operation of converter.

From $t_1$ to $t_2$, voltage is transferred into auxiliary winding 701 and charges capacitor 722 at node F. This charging of capacitor 722 occurs until time $t_2$ when gate drive signal $V_{G706}$ is turned off. As before, auxiliary winding 701 and leakage inductance 703 and 720 help to prevent large power spikes through FETs 706 and 708 by reusing energy to drive capacitor 722. During time $t_2$ to $t_3$ upper FET 706 of phase 1 is turned off and lower FET 708 of phase 1 is turned on delivering current to output 724 at node G through inductor 710. From $t_2$ to $t_5$ gate voltage $V_{G708}$ is fairly constant to lower FET 708 of phase 1 of converter 700. However, at time $t_5$ the voltage across gate signal to lower FET 708 increases due to turn on of gate drive signal $V_{G740}$ of upper FET 740 from phase 2 of converter.

When the gate voltage of MOSFETs are increased (all else being equal) that the "on" resistance of the MOSFET is lowered and thus, for a given current conduction, losses through the MOSFET are lowered. In FIG. 9, it is seen that the voltage is boosted across capacitor 722 because of the voltage in inductor 751 and leakage inductance 753 and transfer of energy to capacitor 722. This higher voltage reduces the "on" resistance in the MOSFET switch, such as FET 708, and reduces the conduction power loss overall. Power waveform $P_{706/708}$ is typically lower during $t_5$ to $t_6$ than normal (and decreasing from $t_2$ to $t_3$) due to this effect of lowering the "on" resistance by increasing the gate drive voltage signal at gate of lower FET 708. This effect can be seen as well from $t_3$ to $t_8$ through the next half of the cycle, which shows an identical mode of operation for phase 2 of converter 700.

FIG. 8 shows a cross section of an "E" core for a planar magnetic structure. This "E" core can be used to implement the dual phase circuit shown in FIG. 7. Nodes A, A', C, C', D, D', E, E', F, and G correspond to the nodes in the circuit diagram of FIG. 7. Input winding 806 (inductor 704) is wound in same orientation around left side leg 818 of core 814 as auxiliary winding 804 to induce a voltage across the winding to charge capacitor 722 during the switching cycle of upper FET 706. Output winding 802 (inductor 710) is loosely coupled with input winding 806 (704), which results in leakage inductance 703 and 720. When current flows in winding 806, flux is induced in left side of core 814 and flows through center gapped leg 816 of core 814. Note that this is the preferred embodiment of the invention. Outside legs of core 814 maybe gapped (e.g. legs 818 and 820) and center leg 816 may not be gapped which would not limit scope of invention as stated. Right side core has corresponding windings 812, 810, and 808 which are wound in orientation to oppose flux due to left side of core to balance the flux through core 814. This orientation of the stated windings is critical to proper operation of circuit. With 'E' core structure and windings of 800 in FIG. 8, efficiency may be optimized by allowing control of leakage inductance through coupling and method of winding of single planar core rather than two separate cores. That is, by coupling both sides of preferred embodiment of circuit 700 into a single core structure, leakage energy absorbed by turn on switching transients of the upper transistors 706 and 740 stored in either one side or the other of structure 800 may be usefully delivered to the load through output inductors 710 and 740 during the on period of FET transistors 706 and 740 significantly improving converter 700's efficiency.

While FIGS. 7–9 depict and describe a two-phase version of the invention, the foregoing principles can be used to fashion n-phase versions of the invention, wherein n is 3, 4, or more.

Figure 10:
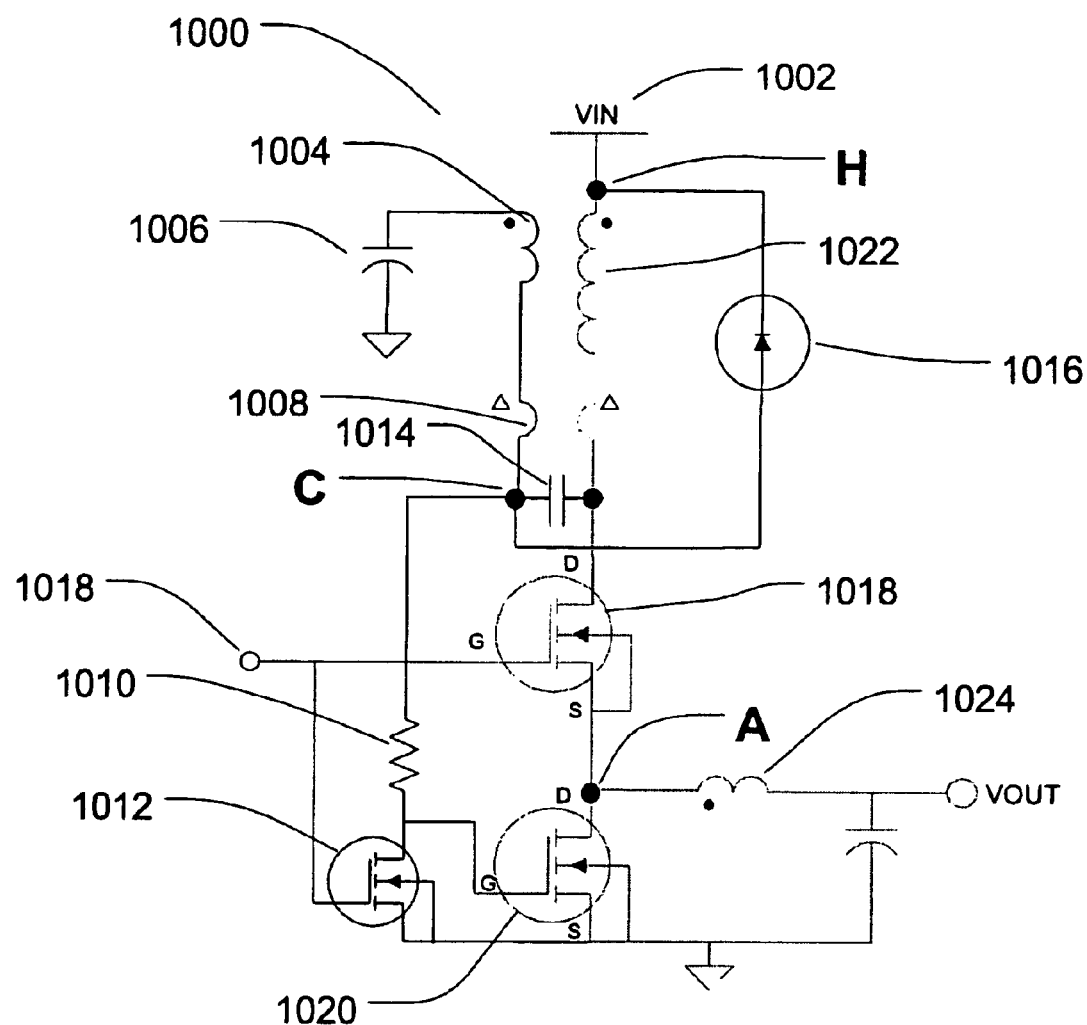
FIG. 10 is a diagram illustrating another embodiment of the present invention showing the addition of a diode and a capacitor to the first embodiment shown in FIG. 5.

FIG. 10 illustrates another embodiment of the invention. The primary components for a single-phase tapped-inductor buck converter are shaded to highlight the main circuit. Auxiliary winding 1004, capacitor 1006, resistor 1010, and gate drive FET 1012 are as described previously in FIG. 5. Capacitor 1014 and diode 1016 are added components of the invention. The purpose of capacitor 1014 and diode 1016 are to limit the voltage of the upper FET 1018 for protection and to aid in steering additional energy to the input when gate drive signal 1018 goes low turning off the upper FET 1018. The auxiliary winding 1004 acts to simultaneously steer current back to the input while driving the lower FET 1020 through gate drive FET 1012 by re-using the stored leakage inductance energy from the coupling of the input coupled inductor 1022 and the output coupled inductor 1024. Thus, efficiency is further increased with the simple addition of two components. This additional feature may be added to the previous dual phase preferred embodiment as well. For example, in the multi-phased version of the preferred embodiment of the invention, the addition of diode 1016 and capacitor 1014 may be added to each individual phase to further improve efficiency in the overall multi-phase converter design. Thus for two or more phases each phase could have the additional diode and capacitor added to the circuit.

In the foregoing discussion, the terms "coupling" and "terminals" are used to describe topological embodiments of intercoupled circuit elements used to implement the invention. Although the foregoing disclosure discusses circuit elements that are coupled to each other directly (i.e. without intervening circuit elements or special connectors), the present invention is not limited to such embodiments. As the use of the term "coupling" rather than "direct coupling" describes, other circuit elements may be present between the elements described herein, so long as such circuit elements do not interfere with the successful operation of the present invention for it's intended purpose. Similarly, although the foregoing discussion refers to many of the circuit elements as including "terminals," such "terminals" are typically not separate elements unto themselves. Rather, the term "terminal" refers simply to the electrical connection of circuit elements to one another, and is used for convenience in describing the topology of the disclosed embodiments.

CONCLUSION

This concludes the description of the preferred embodiments of the present invention. The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A synchronous voltage regulation circuit, comprising:
   an input inductor having an input inductor first terminal coupled to an input signal and an input inductor second terminal;
   a first switch, having a first switch first terminal coupled to the input inductor second terminal, a first switch second terminal, and a first switch control terminal coupled to a control signal;
   a second switch, having a second switch first terminal coupled to the first switch second terminal, a second switch second terminal coupled to ground, and a second switch control terminal;
   an output inductor magnetically coupled to the input inductor according to a first coupling coefficient loosely coupled, the output inductor having an output inductor first terminal coupled to the second switch first terminal, and an output inductor second terminal coupled to an output signal;
   an auxiliary inductor having a first auxiliary inductor terminal coupled to ground via a first capacitor and a second auxiliary inductor terminal coupled to the second switch control terminal via a resistor, wherein the auxiliary inductor is magnetically coupled to the input inductor according to a second coupling coefficient higher than the first coupling coefficient; and
   a third switch, having a third switch first terminal coupled to the second switch control terminal, a control terminal coupled to the control signal.

2. The circuit of claim 1, wherein the input inductor is loosely magnetically coupled to the output inductor and the input inductor is tightly coupled to the auxiliary inductor.

3. The circuit of claim 1, wherein:
   the magnetic coupling between the input inductor and the output inductor manifests a leakage inductance;
   the control signal controls the first switch and the second switch to alternating "on" and "off" states; and
   switching transients caused by a shorted path between the first switch and the second switch are absorbed into the leakage inductance and subsequently delivered to the output during the "on" state of the first switch.

4. The circuit of claim 1, wherein the first switch and the second switch, and the third switch are MOSFETs.

5. The circuit of claim 1, wherein:
   the magnetic coupling between the input inductor and the output inductor manifests a leakage inductance of greater than two nano-henries.

6. The circuit of claim 1, wherein the input inductor, the output inductor, and the auxiliary inductor are wound on a single magnetic core.

7. The circuit of claim 1, further comprising:
   a diode having a diode first terminal coupled to the input signal and a diode second terminal coupled to the second auxiliary inductor terminal; and
   a second capacitor having a second capacitor first terminal coupled to the second auxiliary inductor terminal and a second capacitor second terminal coupled to the input inductor second terminal.

8. The circuit of claim 1, wherein the intercoupled input inductor, output inductor, auxiliary inductor, first switch, second switch, third switch, capacitor and resistor together form a first phase voltage regulation circuit, and wherein the circuit further comprises a second phase voltage regulation circuit having:

- a second phase input inductor having a second phase input inductor first terminal coupled to the input signal and an second phase input inductor second terminal;
- a first second phase switch, having a first second phase switch first terminal coupled to the second phase input inductor second terminal, a first second phase switch second terminal, and a first second phase switch control terminal coupled to the control signal;
- a second second phase switch, having a second second phase switch first terminal coupled to the first second phase switch second terminal, a second second phase switch second terminal coupled to ground, and a second second phase switch control terminal;
- a second phase output inductor magnetically coupled to the second phase input inductor according to a second phase first coupling coefficient loosely coupled, the second phase output inductor having a second phase output inductor first terminal coupled to the second second phase switch first terminal, and a second phase output inductor second terminal coupled to the output signal;
- a second phase auxiliary inductor having a first second phase auxiliary inductor terminal coupled to ground via the first capacitor and a second auxiliary inductor terminal coupled to the second second phase switch control terminal via a second phase resistor, wherein the second phase auxiliary inductor is magnetically coupled to the second phase input inductor according to a second phase second coupling coefficient higher than the second phase first coupling coefficient; and
- a second phase third switch, having a second phase third switch first terminal coupled to the second second phase switch control terminal, a second phase third switch control terminal coupled to the control signal.

9. The circuit of claim 1, wherein:
   the circuit is at least partially implemented in a circuit board having an aperture; and
   at least one of the input inductor, the output inductor and the auxiliary inductor are disposed at the periphery of the aperture.

10. The circuit of claim 2, wherein the magnetic coupling between the auxiliary winding and the input inductor is less than 2 nano-henries.

11. The circuit of claim 6, wherein the magnetic core is substantially planar.

12. The circuit of claim 6, wherein at least one of the inductors comprise windings disposed as traces of a printed circuit board.

* * * * *